US009300329B2

(12) United States Patent
Kumar et al.

(10) Patent No.: US 9,300,329 B2
(45) Date of Patent: Mar. 29, 2016

(54) TURBO-PRODUCT CODES (TPC) WITH INTERLEAVING

(71) Applicant: SK hynix memory solutions inc., San Jose, CA (US)

(72) Inventors: Naveen Kumar, San Jose, CA (US); Zheng Wu, San Jose, CA (US); Jason Bellorado, San Jose, CA (US); Lingqi Zeng, Turlock, CA (US); Marcus Marrow, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 140 days.

(21) Appl. No.: 14/061,600

(22) Filed: Oct. 23, 2013

(65) Prior Publication Data

US 2014/0129899 A1 May 8, 2014

Related U.S. Application Data

(60) Provisional application No. 61/724,093, filed on Nov. 8, 2012, provisional application No. 61/748,364, filed on Jan. 2, 2013.

(51) Int. Cl.
*H03M 13/29* (2006.01)
*H03M 13/53* (2006.01)

(52) U.S. Cl.
CPC ...... *H03M 13/2918* (2013.01); *H03M 13/2927* (2013.01); *H03M 13/2963* (2013.01); *H03M 13/2966* (2013.01)

(58) Field of Classification Search
CPC ... G06F 11/10; G06F 11/1076; H04L 1/0057; H03M 13/2957; H03M 13/29; H03M 13/2918; H03M 13/2927; H03M 13/2963; H03M 13/2966
See application file for complete search history.

(56) References Cited

U.S. PATENT DOCUMENTS

| | | | | | |
|---|---|---|---|---|---|
| 5,185,746 | A | * | 2/1993 | Tanaka et al. | 714/770 |
| 5,333,143 | A | * | 7/1994 | Blaum et al. | 714/766 |
| 5,428,627 | A | * | 6/1995 | Gupta | 714/771 |
| 2002/0026615 | A1 | * | 2/2002 | Hewitt | H03M 13/258 714/752 |
| 2004/0261001 | A1 | * | 12/2004 | Chang | H03M 13/2906 714/784 |
| 2007/0266274 | A1 | * | 11/2007 | Lin | H03M 13/2703 714/699 |
| 2008/0163033 | A1 | | 7/2008 | Yim | |
| 2014/0129899 | A1 | | 5/2014 | Kumar et al. | |
| 2014/0164866 | A1 | | 6/2014 | Bolotov et al. | |

* cited by examiner

*Primary Examiner* — April Y Blair
*Assistant Examiner* — Dipakkumar Gandhi
(74) *Attorney, Agent, or Firm* — IP & T Group LLP

(57) ABSTRACT

Decoding associated with a second error correction code and a first error correction code is performed. Ns first and second-corrected segments of data, first sets of parity information, and second sets of parity information are intersegment interleaved to obtain intersegment interleaved data, where the Ns segments of data, the Ns first sets of parity information, and the Ns second sets of parity information have had decoding associated with the first and the second error correction code performed on them (Ns is the number of segments interleaved together). Decoding associated with a third error correction code is performed on the intersegment interleaved data and interleaved parity information to obtain at least third-corrected interleaved data. The third-corrected interleaved data is de-interleaved.

22 Claims, 25 Drawing Sheets

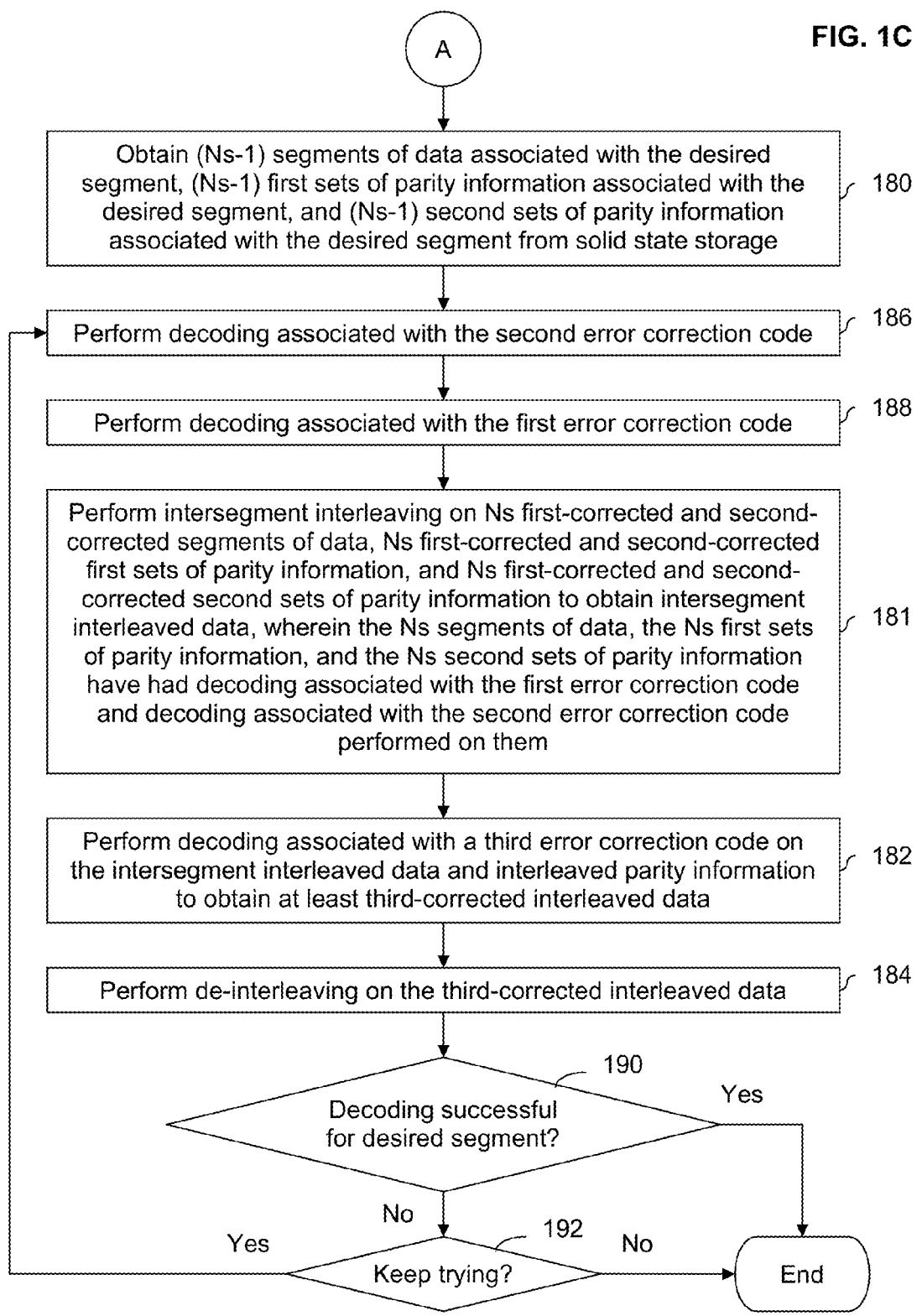

TURBO-PRODUCT CODES (TPC) WITH INTERLEAVING

CROSS REFERENCE TO OTHER APPLICATIONS

This application claims priority to U.S. Provisional Patent Application No. 61/724,093 entitled MULTI-LEVEL TPC FOR NAND FLASH TECHNOLOGY filed Nov. 8, 2012 and U.S. Provisional Patent Application No. 61/748,364 entitled SCHEME FOR ERROR-FLOOR REDUCTION FOR MULTI-LEVEL TURBO-PRODUCT CODES (TPC) filed Jan. 2, 2013, both of which are incorporated herein by reference for all purposes.

BACKGROUND OF THE INVENTION

Turbo-product codes (TPC) are being explored for use in next generation solid state storage systems. Although current TPC techniques have a number of attractive features, one downside of current TPC techniques is the associated error floor. At high signal to noise (SNR) ratios, the page failure rate (PFR) with current TPC techniques flattens out. To put it another way, when the bit error rate (BER) is low, performance is relatively flat. In contrast, error correction codes used in current solid state storage solutions have a waterfall-like performance curve in the high SNR (i.e., low BER) region so that there is no leveling-off of performance. New TPC techniques which push down the error floor (e.g., so that the PFR at which the performance curve levels out is better than before) would be desirable.

BRIEF DESCRIPTION OF THE DRAWINGS

Various embodiments of the invention are disclosed in the following detailed description and the accompanying drawings.

FIGS. 1B and 1C show a flowchart illustrating an embodiment of an intersegment TPC interleaved decoding process.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1A:
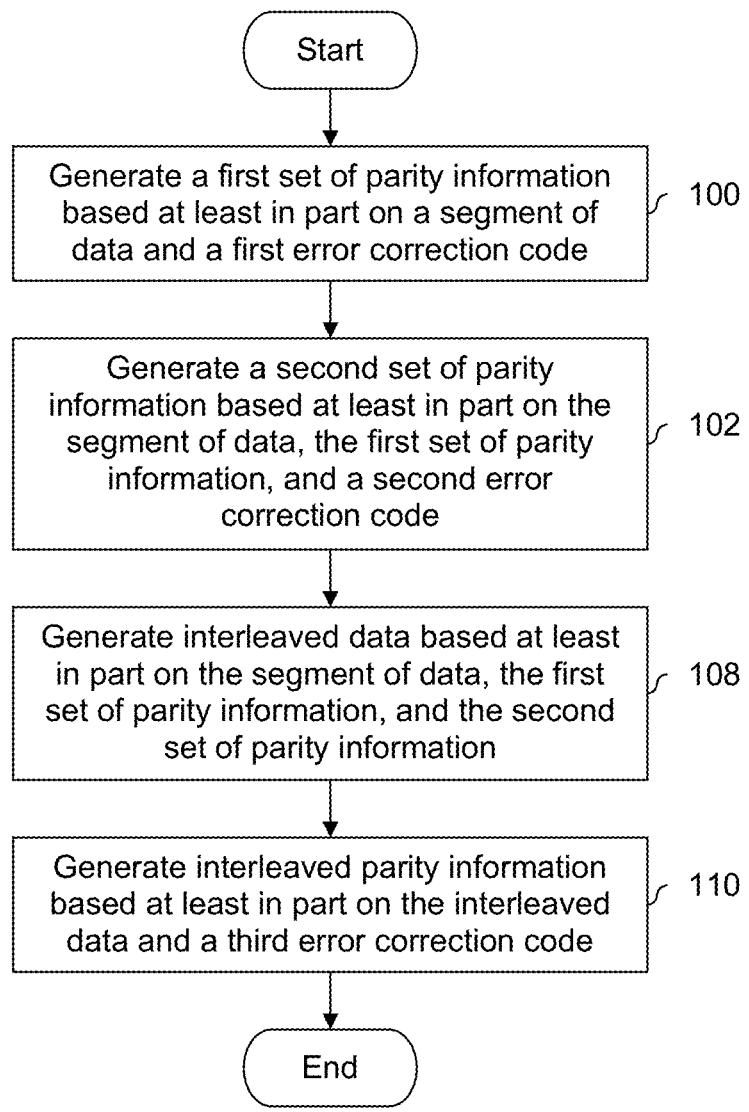
FIG. 1A is a flowchart illustrating an embodiment of a process for encoding information using turbo-product codes (TPC) with interleaving.

FIG. 1A is a flowchart illustrating an embodiment of a process for encoding information using turbo-product codes (TPC) with interleaving. In some embodiments, the process is performed by a write processor in a storage system, such as a solid state storage system (e.g., NAND Flash). In some embodiments, the process is performed by a transmitter in a communication system, such as a wireless communication system.

At 100, a first set of parity information is generated based at least in part on a segment of data and a first error correction code. In one example, the first code is a BCH code and the segment of data is arranged as an array (e.g., with some number of rows and some number of columns) where each row is encoded (e.g., independent of any other row) using the BCH code to produce a plurality of rows of parity information. The generated rows of parity information are an example of a first set of parity information.

At 102, a second set of parity information is generated based at least in part on the segment of data, the first set of parity information, and a second error correction code. To continue the example from above, the segment of data and first set of parity information are arranged as an array (e.g., having the same number of rows as the array input to step 100, but with the first set of parity information added on as additional columns). In this example at least, columns are grouped together (e.g., two columns per group, three columns per group, etc.) and the groups of columns are each encoded using another BCH code. Note that it is not necessary for the number of columns grouped together to be an integer number of columns (e.g., each group may include 1.5 columns per group, or some other non-integer number of columns).

At 108, interleaved data is generated based at least in part on the segment of data, the first set of parity information, and the second set of parity information. Interleaving is a reordering or rearrangement of data, so the number of bits input at step 108 matches the number of bits which are output at step 108. In one example, the interleaved data generated at 108 comprises multiple groups of interleaved data and each group of interleaved data includes a single sample from one of multiple codewords (e.g., first code codewords or second code codewords). In such embodiments, when encoding with a third code (subsequently at step 110), the third code will span multiple codewords of the first two codes. This is desirable because it can break up errors which prevent a first code and a second code from successfully decoding a segment.

At 110, interleaved parity information is generated based at least in part on the interleaved data and a third error correction code. For example, the interleaved data at step 108 may rearrange data within some array and error correction encoding is performed along the rows of the interleaved array using a BCH code. Alternatively, the interleaved data may be encoding in the vertical direction. Note that "interleaved parity information" does not refer to parity information which is interleaved, but rather parity information which is generated from interleaved data.

The interleaved parity information generated at 110 and/or the third code (the two terms may be used interchangeable herein) is used on an if needed basis (e.g., if the first code and second code by themselves are unable to successfully decode a desired segment). Put another way, although interleaved parity information is always generated, in some cases the interleaved parity information is not used during the decoding process (e.g., because the first code and the second code are sufficient for decoding).

The process shown in FIG. 1A includes both intrasegment TPC interleaving and intersegment TPC interleaving. In intrasegment TPC interleaving, information associated with a single segment is interleaved at step 108. To use an analogy, intrasegment TPC interleaving is like shuffling a single pack of cards (whereas intersegment TPC interleaving is like shuffling multiple packs of cards). In FIG. 1A, in intrasegment TPC interleaving embodiments, steps 100 and 102 are only performed once and then the process goes to step 108 (e.g., because all of the inputs to the interleaver are ready).

In intersegment TPC interleaving, information associated with multiple segments is interleaved. For example, if two segments are interleaved, steps 100 and 102 are each performed twice. When step 100 (e.g., row encoding) and step 102 (e.g., column encoding) are performed for the first time, it is on a first segment; when step 100 (e.g., row encoding) and step 102 (e.g., column encoding) are performed for the second time, it is on the second segment. Only then is all of the information ready for the interleaver and step 108 can be performed. Interleaving is then performed at step 108 on the first segment of data, the second segment of data, the first set of parity information associated with the first segment of data, the first set of parity information associated with the second segment of data, the second set of parity information associated with the first segment of data, and the second set of parity information associated with the second segment of data.

Additional examples of FIG. 1A are described in further detail below.

When it comes time to decode the stored data, there are two possibilities: (1) there is a penalty (e.g., associated with having to fetch additional segments, other than the desired one) in order to use the third code during decoding or (2) there is no penalty for using the third code during decoding (e.g., because there is no need to fetch additional segments beyond the desired one in order to use the third code during decoding). For the latter case, all three codes are used from the initial attempts. There is little real penalty in using all three codes since all of the codes span the exact same data set and using the third code (in addition to the first and second codes) from the initial decoding attempts will improve the decoding performance. Technically, there may be a penalty associated with the parity of the third code, however, that is negligible when compared to the overall data size.

If there is a penalty associated with using the third code during decoding (e.g., because other segments in addition to the desired segment must be fetched from storage), then decoding begins with just the first code and the second code. Most segments will probably decode during this period and so for most segments the third code will not be used during decoding. In this scenario (which includes intersegment TPC interleaving), the third code is used on an as-needed basis. This is to avoid the penalty associated with using the third code, specifically the need to transfer all of the other required data segments from solid state storage to the read processor in order conduct decoding. Storage controllers are evaluated and compared based on their decoding time, and having to transfer all other data segments from solid state storage to the read processor (for every segment, not just the ones that are having trouble being decoded) incurs a penalty. As such, the third code is used during decoding on an if needed basis in intersegment TPC interleaved embodiments and some other embodiments.

Figure 1B:
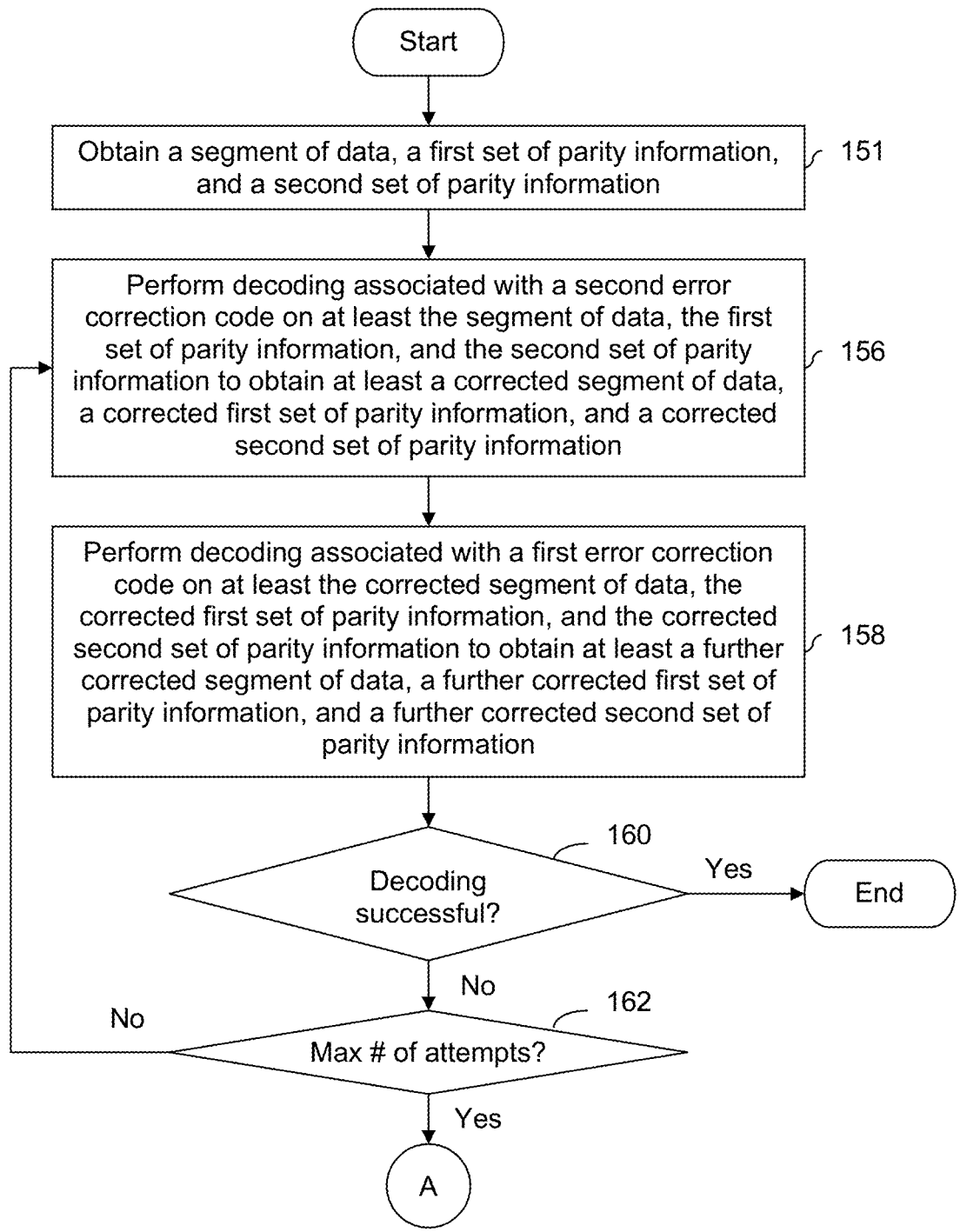

FIGS. 1B and 1C show a flowchart illustrating an embodiment of an intersegment TPC interleaved decoding process. In some embodiments, the process shown is performed by a read processor in a storage system. In other embodiments, the process is performed by a receiver in a communication system.

As is described above, because there is a penalty for using the third code during intersegment TPC interleaved decoding (namely, the time spent fetching the other segments which are interleaved together with the desired segment), the third code is only used on as if needed basis during the intersegment TPC interleaved decoding process shown. A benefit to the technique described herein is that most segments can be decoded without using the third code and/or without requiring information associated with another segment. Only when the first code and the second code are insufficient to decode a desired segment (e.g., a maximum number of decoding attempts is reached without successfully decoding the desired segment) does the third code get involved. Using the third code on an if needed basis is attractive because using the third code for each and every segment consumes unnecessary power, bandwidth, and/or other resources which are not absolutely necessary (e.g., because the first code and the second code would have been enough on their own). With this in mind, the process of FIG. 1B begins at 151 by obtaining a segment of data, a first set of parity information, and a second set of parity information. For example, all of the information obtained at 151 may be obtained from solid state storage (e.g., NAND Flash). Naturally, the information obtained at 151 may include errors.

At 156, decoding associated with a second error correction code is performed on at least the segment of data, the first set of parity information, and the second set of parity information to obtain at least a corrected segment of data, a corrected first set of parity information, and a corrected second set of parity information. In some cases, errors may still remain in the corrected information after step 156. In some cases, the error correction decoding may be unable to reduce the number of errors and the corrected information matches the corresponding piece of information which was input to step 156.

At 158, decoding associated with a first error correction code is performed on at least the corrected segment of data, the corrected first set of parity information, and the corrected second set of parity information to obtain at least a further corrected segment of data, a further corrected first set of parity information, and a further corrected second set of parity information.

In addition to being able to decode each segment without using the third code (e.g., assuming conditions are correct), each segment is able to be decoded without using information associated with another segment. Being able to decode each segment without requiring information from any other segment may be desirable for those systems where each segment (e.g., plus its associated first set of parity information and second set of parity information) is designed to fit the width of a single I/O access (e.g., the width of a data bus between a storage controller "chip" and a solid state storage "chip"). Thus, if each segment can be decoded independent of any other segment, then only a single I/O read or access is required. Requiring two or more I/O reads in order to read and decode a single segment may be unattractive.

Note that the ordering of steps 156 and 158 is merely exemplary and may be switched if desired.

At 160, it is determined if decoding is successful. For example, if the first code and the second code indicate there are no remaining errors, then the segment is determined to be successfully decoded and the segment is output. If decoding is unsuccessful, then it is determined at 162 if a maximum number of attempts has been reached. For example, the first code and the second code may be given ten attempts (e.g., each) to decode the desired segment before going to the third code. It is not uncommon for a segment to require two or more decoding passes (e.g., each) using the second code at 156 and the first code at 158, and so the maximum number of attempts at 162 is typically two or more so that two or more attempts are granted before "giving up" and using the third code as well as the first code and second.

If the maximum number of attempts has not been reached, then decoding associated with a second error correction code is attempted again at 156. If the maximum number of attempts has been reached, then the process performed in the following figure is performed.

As is shown in FIG. 1B, the third code is used on an if needed basis if the first code and second code (by themselves) are unable to successfully decode a desired segment. Most segments will eventually be able to exit step 160 with a successful decoding result before hitting the maximum number of attempts at step 162.

If, however, decoding using the third code is appropriate (e.g., because the maximum number of attempts is reached), then the intersegment TPC interleaved decoding process continues in FIG. 1C. In some embodiments, a data flush is performed at this point so that intermediate data or intermediate results from FIG. 1B are discarded and are not used in FIG. 1C.

At 180, (Ns−1) segments of data associated with the desired segment, (Ns−1) first sets of parity information associated with the desired segment, and (Ns−1) second sets of parity information associated with the desired segment are obtained from solid state storage. Ns is the number of segments which are interleaved together, so if Ns=4 (as an example) then the three other segments interleaved together with the desired segment are obtained, as well as their parity information. This retrieval at 180 has a penalty associated with it, so it is only performed if the desired segment is unable to be decoded using only the first and second codes.

At 186, decoding associated with the second error correction code is performed. For example, if Ns=4, then the other three segments (which are interleaved together with the desired segment) are obtained from solid state storage (along with their respective (Ns−1) first sets of parity information and (Ns−1) second sets of parity information) and are decoded using the second code. In this example, it is not necessary to process the desired segment again, since it has already been decoded using the second code at step 156 in FIG. 1B.

At 188, decoding associated with the first error correction code is performed. For example, the (Ns−1) segments and parity information output by step 186 may be input to step 186 for decoding using the first error correction code. If desired, steps 186 and 188 and may repeated as many times as is desired on the (Ns−1) segments before proceeding to step 181. Note that the ordering of steps 186 and 188 may be swapped (e.g., decoding with the first code may be performed before decoding with the second code).

At 181, intersegment interleaving is performed on Ns first-corrected and second-corrected segments of data, Ns first-corrected and second-corrected first sets of parity information, and Ns first-corrected and second-corrected second sets of parity information to obtain intersegment interleaved data, wherein the Ns segments of data, the Ns first sets of parity information, and the Ns second sets of parity information have had decoding associated with the first error correction code and decoding associated with the second error correction code performed on them. As used herein, "first-corrected" refers to some information which has been (e.g., most recently) corrected using the first (error correction) code. Similarly, "second-corrected" and "third-corrected" refer to information which has been (e.g., most recently) corrected (respectively) using a second code or a third code.

At 182, decoding associated with a third error correction code is performed on the intersegment interleaved data and interleaved parity information to obtain at least third-corrected interleaved data. At 184, de-interleaving is performed on the third-corrected interleaved data. Note that the ordering in which codes are used shown herein (in this example, second code, first code, and then third code) is merely exemplary and is not intended to be limiting.

It is determined at 190 if decoding is successful for the desired segment. For example, if no errors are flagged by any of the codes, then the successfully decoded desired segment is output and the process ends. If not, at 192, it is determined whether to keep trying. If not, the process ends and a decoding failure is declared. In one example, step 192 includes checking the number of iterations on the third code. If decoding using the third code exceeds some maximum number of iterations, then the process decides to stop trying and a decoding failure is declared. (Note that if a maximum number of attempts is used at 192, that maximum number of attempts is not required to match the maximum number of attempts at 162 in FIG. 1B). If it is determined to keep trying, then the process returns to step 186 for another decoding pass.

Depending upon the particular implementation (e.g., depending upon what information is actually stored or transmitted), various embodiments of FIGS. 1A-1C may include a variety of steps. More specific examples of FIGS. 1A-1C are described in further detail below.

Figure 2:
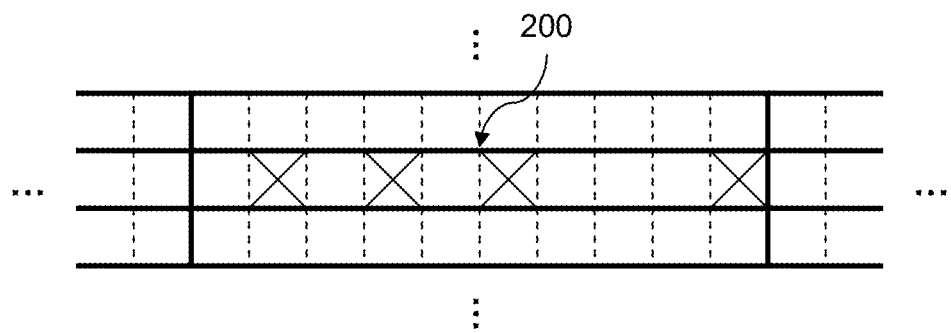
FIG. 2 is a diagram illustrating an example of a problem with TPC systems that do not incorporate interleaving.

FIG. 2 is a diagram illustrating an example of a problem with TPC systems that do not incorporate interleaving. In the example shown, array element 200 (at row j and columns k–(k+9)) is an element in a TPC array. In this example of a conventional TPC system, a T=3 BCH code is applied to each row in the horizontal direction, where T is the maximum number of errors that can be corrected (i.e., so that a maximum of three errors per row can be corrected using the first code). In the vertical direction, columns are grouped, ten columns to a group. Each group of ten columns is error correction encoded using a second T=3 BCH code so that a maximum of three errors (per group of ten columns) can be corrected using the second code.

In array element 200, there are 4 bit errors, which is beyond the error correction capability of both the first code in the horizontal direction and the second code in the vertical direction. During TPC decoding, decoding alternates between the first code in the horizontal direction and the second code in the vertical direction, so that they take turns decoding in the hopes that the two codes will gradually bring down the number of errors until all errors have been corrected. However, in this example, since the number of errors is beyond the error correction capability of both the first code and the second code, TPC decoding will be unable to bring down the number of errors in array element 200.

In contrast, TPC with interleaving (e.g., intrasegment TPC interleaving or intersegment TPC interleaving), is able to correct the errors shown in array element 200. If TPC with interleaving was used instead and the example error pattern was received, the de-interleaving process (e.g., performed at a read processor or receiver) would cause the four errors shown in array element 200 to be dispersed amongst multiple rows and/or multiple groups of ten columns. Essentially, de-interleaving causes the errors to be broken up into different codewords of the third code, such that the third code corrects them. The third code eliminates or reduces a weakness in traditional TPC. That is, a small number of errors in bad locations will cause a decoding failure. Interleaving causes such errors in bad locations to be separated into different codewords in the third code, so that the third error correction decoder can work individually on those errors in the different codewords in the third code space.

The following figures describe a first example of intrasegment TPC interleaving.

Intrasegment TPC Interleaving Example 1

Figure 3:
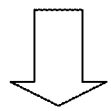
FIG. 3 is a diagram illustrating an embodiment of a first set of parity information generated using a first code.

FIG. 3 is a diagram illustrating an embodiment of a first set of parity information generated using a first code. In various embodiments, the processing is performed by an intrasegment TPC interleaving system or an intersegment TPC interleaving system. For convenience, a relatively small segment of data is shown in this figure and the following figures. Naturally, the sizes and dimensions shown are merely exemplary and the techniques described herein are applicable to any size or dimension.

Each of rows 300a-300d is independently error correction encoded using the first code (e.g., a BCH code) to obtain respective parity information. Row 300a is error correction encoded to generate parity information 302a, row 300b is error correction encoded to generate parity information 302b, row 300c is error correction encoded to generate parity information 302c, and row 300d is error correction encoded to generate parity information 302d. Parity information 302a-302d shows an example of a first segment of data generated at step 100 in FIG. 1A.

Figure 4:
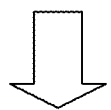
FIG. 4 is a diagram illustrating an embodiment of a second set of parity information generated using a second code.

FIG. 4 is a diagram illustrating an embodiment of a second set of parity information generated using a second code. The example shown here is applicable to both an intrasegment TPC interleaving system as well as an intersegment TPC interleaving system. FIG. 4 continues the example of FIG. 3.

In the example shown, pairs of columns are grouped together and error correction encoding is performed (e.g., using a BCH code) on pair of columns 400a, pair of columns 400b, and pair of columns 400c. Parity bit 402a is generated from pair of columns 400a, parity bit 402b is generated from pair of columns 400b, and parity bit 402c is generated from pair of columns 400c. A pair of columns may be input into an error correction encoder in any order. For example, pair of columns 400a may be encoded in the sequence [D11 D12 D21 ... D32 D41 D42] or in the sequence [D11 D21 D31 ... D22 D32 D42]. Parity bits 402a-402c show an example of a second set of parity information generated at step 102 in FIG. 1A. Naturally, any number of columns may be grouped together. In some embodiments, a non-integer number of columns are grouped together (e.g., 2.5 columns are grouped together).

A benefit to grouping columns is that less overhead information is generated. For example, if columns were not grouped, then a parity bit would be generated for each column, producing 6 parity bits in this example. This is twice as many parity bits as compared to when two columns are grouped together and then error correction encoded.

Figure 5:
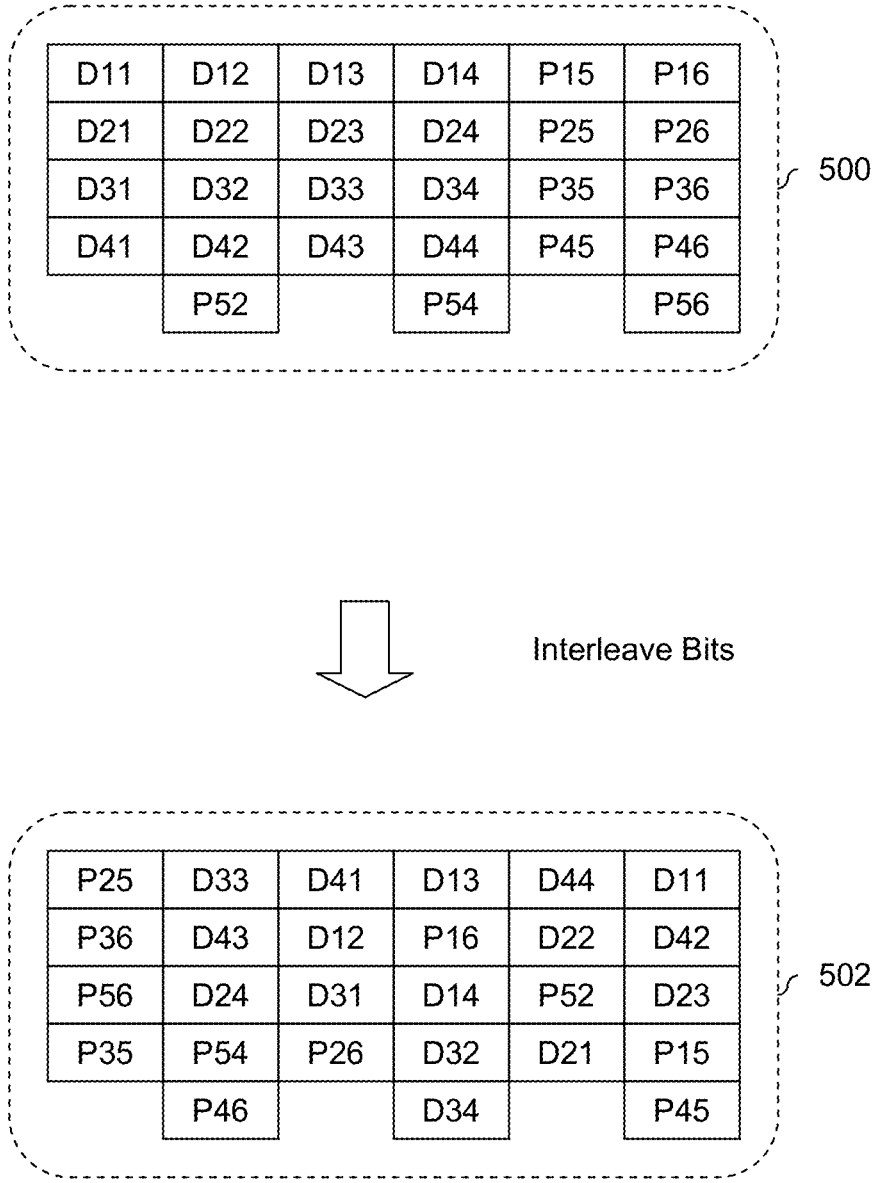
FIG. 5 is a diagram illustrating an embodiment of interleaved data generated by an intrasegment TPC interleaving system.

FIG. 5 is a diagram illustrating an embodiment of interleaved data generated by an intrasegment TPC interleaving system. FIG. 5 follows the example of FIG. 4. The example shown herein is an intrasegment TPC interleaving example, and thus a segment of data, a first set of parity information, and a second set of parity information for a single segment are interleaved (e.g., without being mixed with information associated with another segment). Interleaving rearranges the sequence or ordering of data, and thus the amount of data before interleaving is the same as that after interleaving (i.e., the size of pre-interleaved data 500 is the same as interleaved data 502). In this example, pre-interleaved data 500 is interleaved using a random pattern to generate interleaved data 502. Any kind of interleaving will work as long it randomly interleaves all row and column constituent codes. The idea behind an interleaver is to break the stuck error patterns which are not decodable by row and column decoding. The interleaver will spread out all the errors, which will eventually get decoded using the third code. The lowest weight error patterns, which are dominant in the error floor of the TPC, are patterns in one row code, as well as in one column code, as in the example of FIG. 2. A diagonal interleaver can breakup each bit in this error pattern to a different codeword of the third code, which thus can be corrected by the third code.

Figure 6:
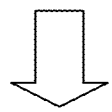
FIG. 6 is a diagram illustrating an embodiment of interleaved parity information generated by an intrasegment TPC interleaving system.

FIG. 6 is a diagram illustrating an embodiment of interleaved parity information generated by an intrasegment TPC interleaving system. FIG. 6 continues the example of FIG. 5.

In this example, pairs of columns 600a-600c are error correction encoded using a third code (e.g., a BCH code) to generate (respectively) parity bits 602a-602c. In some other embodiments (not shown), rows of data as opposed to columns of data are error correction encoded using a third code in order to generate interleaved parity information. Parity bits 602a-602c are an example of interleaved parity information generated at step 110 in FIG. 1A.

Figure 7:
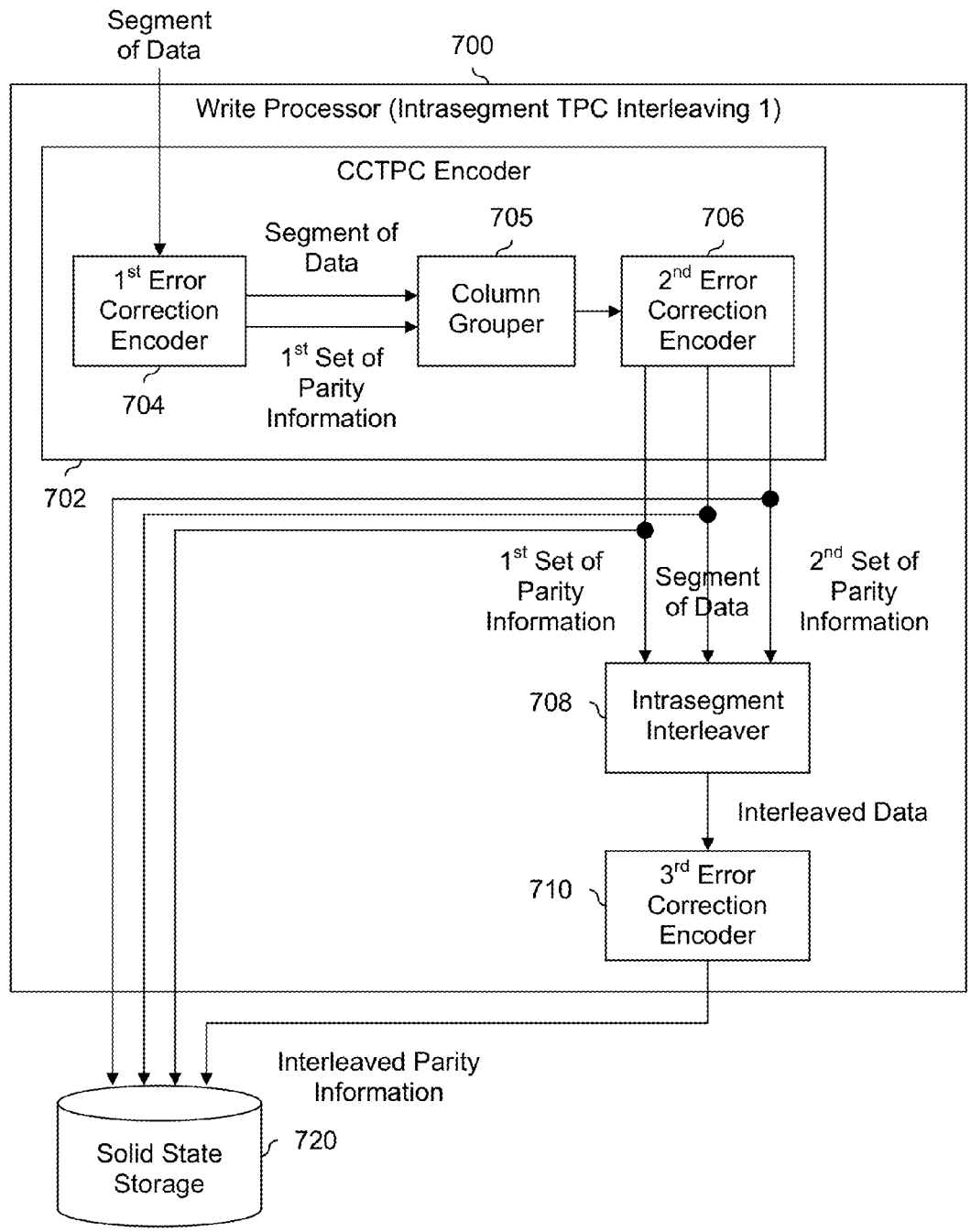
FIG. 7 is a diagram illustrating an embodiment of a first intrasegment TPC interleaving write processor.

FIG. 7 is a diagram illustrating an embodiment of a first intrasegment TPC interleaving write processor. FIG. 7 shows an example of a system which performs the processing shown in FIGS. 1A and 3-6. In some embodiments, write processor 700 is implemented using a semiconductor device, such as an application-specific integrated circuit (ASIC) or a field-programmable gate array (FPGA). Although a storage system is shown herein, similar components may be employed by a transmitter in a communications system (e.g., before being transmitted over a wireless channel or wire-line connection).

A segment of data is input to write processor 700. First error correction encoder 704 inputs the segment of data and outputs the segment of data, as well as a first set of parity information. For example, first error correction encoder 704 performs the processing shown in FIG. 3.

The segment of data and first set of parity information are passed from first error correction encoder 704 to column grouper 705. Column grouper 705 groups any number of columns together and then second error correction encoder 706 encodes the grouped columns to generate the segment of data, the first set of parity information, and the second set of parity information. For example, column grouper 705 and second error correction encoder 706 perform the grouping and encoding shown in FIG. 4. Together, first error correction encoder 704, column grouper 705, and second error correction encoder 706 comprise column combining, turbo-product code (CCTPC) encoder 702.

Intrasegment interleaver 708 inputs the segment of data, the first set of parity information, and the second set of parity information and interleaves all of the bits to produce interleaved data. Intrasegment interleaver 708 is configured to interleave information for a single segment. FIG. 5 shows an example of the processing performed by intrasegment interleaver 708.

The interleaved data is passed from intrasegment interleaver 708 to third error correction encoder 710, which generates interleaved parity information using a third code. FIG. 6 shows an example of the processing performed by third error correction encoder 710. In this example, the segment of data, first set of parity information, second set of parity information, and interleaved parity information are stored in solid state storage 720. In some embodiments, the segment of data, first set of parity information, second set of parity information, and interleaved parity information fit into a single read (e.g., a page), so that all of the information can be read back in a single access.

Figure 8A:
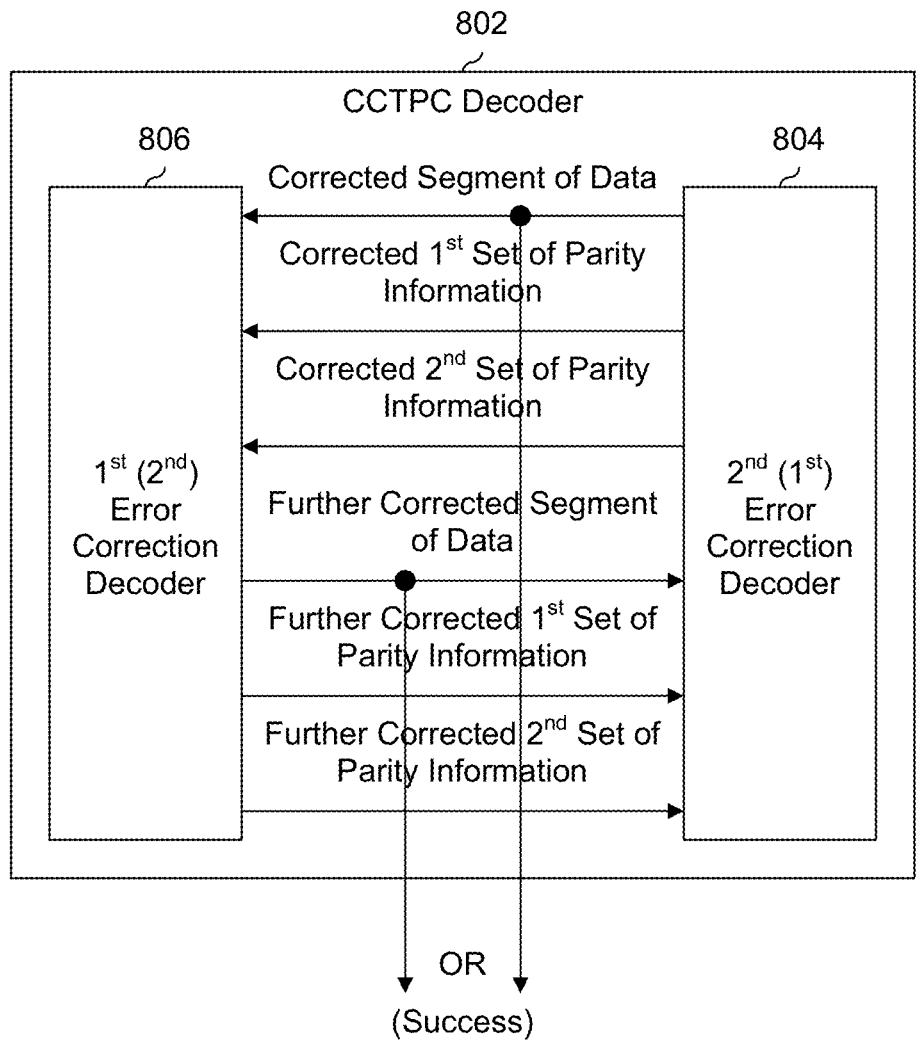
FIG. 8A is a diagram illustrating an embodiment of a column combining, turbo-product code (CCTPC) decoder.

FIG. 8A is a diagram illustrating an embodiment of a column combining, turbo-product code (CCTPC) decoder. CCTPC decoder 802 includes first error correction decoder 806 and second error correction decoder 804. CCTPC decoder 802 corresponds to CCTPC encoder 702 in FIG. 7, first error correction decoder 806 corresponds to first error correction encoder 704 in FIG. 7, and second error correction decoder 804 corresponds to second error correction encoder 706 in FIG. 7. A segment of data (e.g., read from solid state storage, possibly with errors), a first set of parity information (e.g., read from solid state storage, possibly with errors), and a second set of parity information (e.g., read from solid state storage, possibly with errors) may be input (not shown) to second error correction decoder 804 which generates a corrected segment of data, a corrected first set of parity information, and a corrected second set of parity information. In some cases, second error correction decoder 804 is unable to make any corrections (e.g., because the number of errors exceeds the error correction capability of the second code) and information which is output is the same as the information which is input.

First error correction decoder 806 inputs the corrected segment of data, the corrected first set of parity information, and the corrected second set of parity information and outputs a further corrected segment of data, a further corrected first set of parity information, and a further corrected second set of parity information. Note that the ordering of decoding shown herein is merely exemplary and may be changed as desired. For example, as is shown in FIG. 8A, in some cases, error correction decoding associated with the first code is performed first.

If both the first code and the second code indicate that there are no errors, then the segment is output by read processor 800. If not, second error correction decoder 804 and first error correction decoder 806 take turns decoding until a maximum number of attempts is reached, or until the segment is successfully decoded and output. In some cases, the maximum number of attempts is set to 1, so that the first code and the second code are only used once before the third code is attempted. The following figure shows an example of this. In some other embodiments (e.g., intersegment TPC interleaving), the maximum number of attempts is set to 2 or more (e.g., because there is a penalty associated with decoding using the third code, so it is not desirable to go to the third code after only one decoding attempt with the first code and the second code).

Figure 8B:
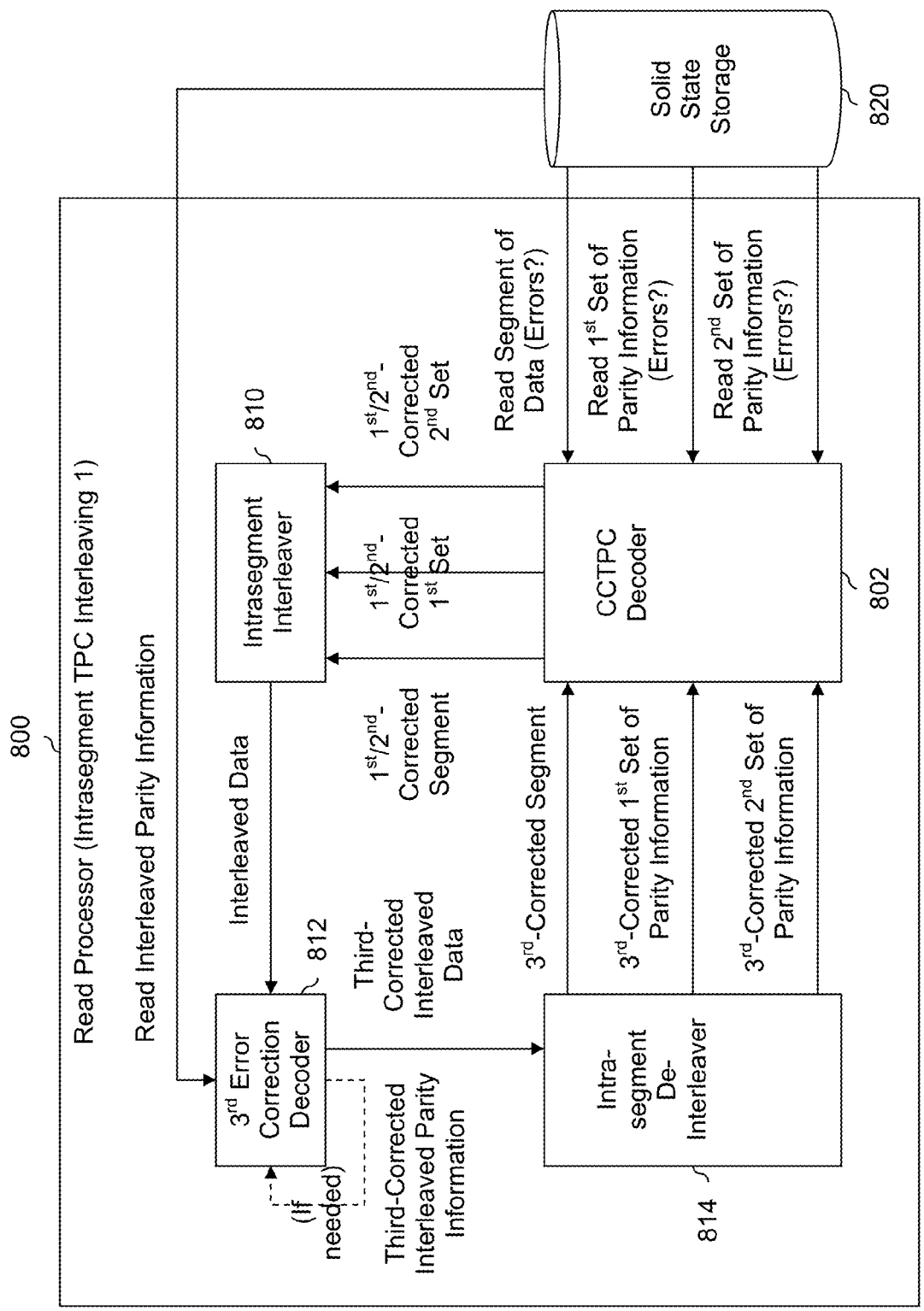
FIG. 8B is a diagram illustrating an embodiment of a first intrasegment TPC interleaving read processor.

FIG. 8B is a diagram illustrating an embodiment of a first intrasegment TPC interleaving read processor. In the example shown, read processor 800 corresponds to write processor 700 in FIG. 7. In some embodiments, read processor 800 is implemented using a semiconductor device, such as an application-specific integrated circuit (ASIC) or a field-programmable gate array (FPGA). Read processor 800 shows one example of a system which decodes data encoded as shown in FIGS. 3-6.

In the example shown, read segment of data (possibly with errors), read first set of parity information (possibly with errors), and read second set of parity information (possibly with errors) are input to CCTPC decoder 802 from solid state storage 820. FIG. 8A shows a more detailed view of CCTPC decoder 802. As is described above, CCTPC decoder 802 performs decoding using the first code and the second on the information from solid state storage. In this particular intrasegment TPC interleaving example, CCTPC decoder 802 attempts decoding once and then does not perform decoding again until after the third code is attempted. If CCTPC decoder 802 detects no errors, then the successfully decoded segment is output and read processor stops (or proceeds with reading and processing the next desired segment).

If CCTPC decoder 802 is unable to decode the desired segment, then a first and second corrected segment, a first and second corrected first set of parity information, and a first and second corrected second set of parity information are passed to intrasegment interleaver 810. Intrasegment interleaver 810 performs the same interleaving as intrasegment interleaver 708 in FIG. 7. Since third error correction decoder 812 is expecting to see interleaved data (and not in un-interleaved form), intrasegment interleaver 810 operates on input information in order to put it into a form expected by third error correction decoder 812. The interleaved data is passed from intrasegment interleaver 810 to third error correction decoder 812. Third error correction decoder 812 generates third-corrected interleaved data and third-corrected interleaved parity information.

Intrasegment de-interleaver 814 inputs the third-corrected interleaved data, performs the inverse of the reordering or re-sequencing performed by intrasegment interleaver 810, and outputs a third-corrected segment, third-corrected first set of parity information, and third-corrected second set of parity information from the third-corrected interleaved data (e.g., one example of step 184 in FIG. 1C). If third error correction decoder 812 was able to remove all of the remaining errors, then the successfully decoded segment is output and read processor 800 stops processing or continues on to the next segment.

If some errors still remain in the desired segment (e.g., indicated by one or more of the codes), then CCTPC decoder 802 inputs the third-corrected segment, third-corrected first set of parity information, and third-corrected second set of parity information and processes the information. This processing loop between CCTPC decoder 802, intrasegment interleaver 810, third error correction decoder 812, and intrasegment de-interleaver 814 may continue for as long as is needed or until a maximum number of attempts is reached.

Note that the sequences of codes shown in this figure and in other figures are merely exemplary. Any sequence of codes (e.g., (code 1, code 2, code 3) or (code 3, code 1, code 2) and so on) may be used.

The intrasegment TPC interleaving embodiment described above brings down the error floor compared to traditional TPC systems. However, it would be desirable if the amount of overhead information associated with the third code could be brought down even further. The following figures describe an intersegment TPC interleaving embodiment which permits a reduction in the amount of overhead information associated with the third code (per segment). In the following figures, since four segments (an exemplary number) are interleaved together before error correction encoding with the third code, per segment, the amount of overhead information associated with the third code is reduced.

Intersegment TPC Interleaving Example

Figure 9:
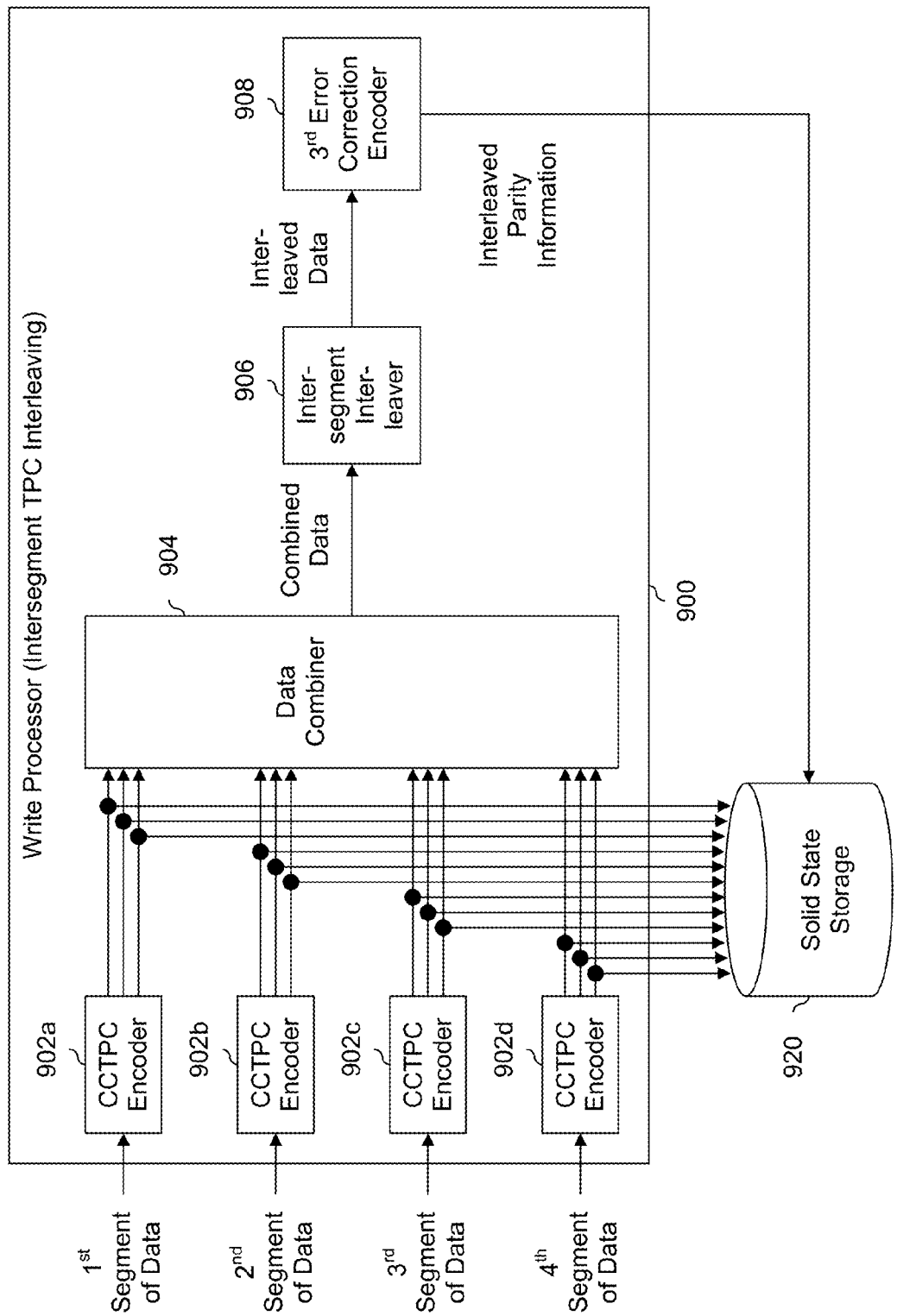
FIG. 9 is a diagram illustrating an embodiment of an intersegment TPC interleaving write processor.

FIG. 9 is a diagram illustrating an embodiment of an intersegment TPC interleaving write processor. FIG. 9 is one embodiment of a system which performs the process of FIG. 1A. In the example shown, four segments of data are input (respectively) to CCTPC encoders 902a-902d. CCTPC encoders 902a-902d operate as described above in FIG. 7 (e.g., using a first code and a second code to respectively generate a first set of parity information and second set of parity information for the segment of data input to that particular CCTPC encoder). To preserve readability, the first error correction encoders and second error correction encoders which are included in the CCTPC encoders are not shown in FIG. 9. Each of CCTPC encoders 902a-902d outputs the particular segment of data input to that particular CCTPC encoder, a corresponding first set of parity information, and a corresponding second set of parity information (not labeled in FIG. 9 for readability).

Data combiner 904 combines the four data segments, four first sets of parity information, and four second sets of parity information which are input and outputs combined data. Data combiner 904 may be thought of as a concatenater, or as a 12-to-1, parallel-to-serial converter, where the values of the bits are not changed and the inputs are merely collected or gathered together.

The combined data is interleaved by intersegment interleaver 906 to produce interleaved data. Any desired interleaving pattern may be used, such as a random interleaving pattern, or a diagonal interleaving pattern. Unlike intrasegment interleaver 708 in FIG. 7, intersegment interleaver 906 is configured to mix or interleave information from multiple segments, in this case four segments. The interleaved data is passed to third error correction encoder 908 which generates interleaved parity information using a third code.

The four segments of data, four first sets of parity information, four second sets of parity information, and interleaved parity information are stored in solid state storage 920. As before, the third code is used on an if needed basis, so decoding will start with the first code or the second code and the third code is not used unless it is determined that the first code and second code will not be successful in decoding the segment (e.g., a maximum number of attempts is reached). As such, it is more efficient for the read processor if the uninterleaved data (which is ready to be decoded using either the first code or the second code) is stored in solid state storage 920 as opposed to the interleaved data output by intersegment interleaver 906.

In some applications, although a page (e.g., 16 kB) is the smallest unit that can be read back from solid state storage, a storage controller (e.g., which includes a read processor) can opt to transfer any 4 kB segment it likes from the solid state storage to the storage controller. In the storage industry, the speed at which a 4 kB segment can be read back and decoded is an important figure of merit for evaluating and/or comparing different storage controllers. Because of this, in some embodiments, each segment of data (e.g., input into write processor 900) is 4 kB so that each segment can be read individually relatively quickly (and thus the storage controller has a good performance measurement as compared to its competitors).

Figure 10:
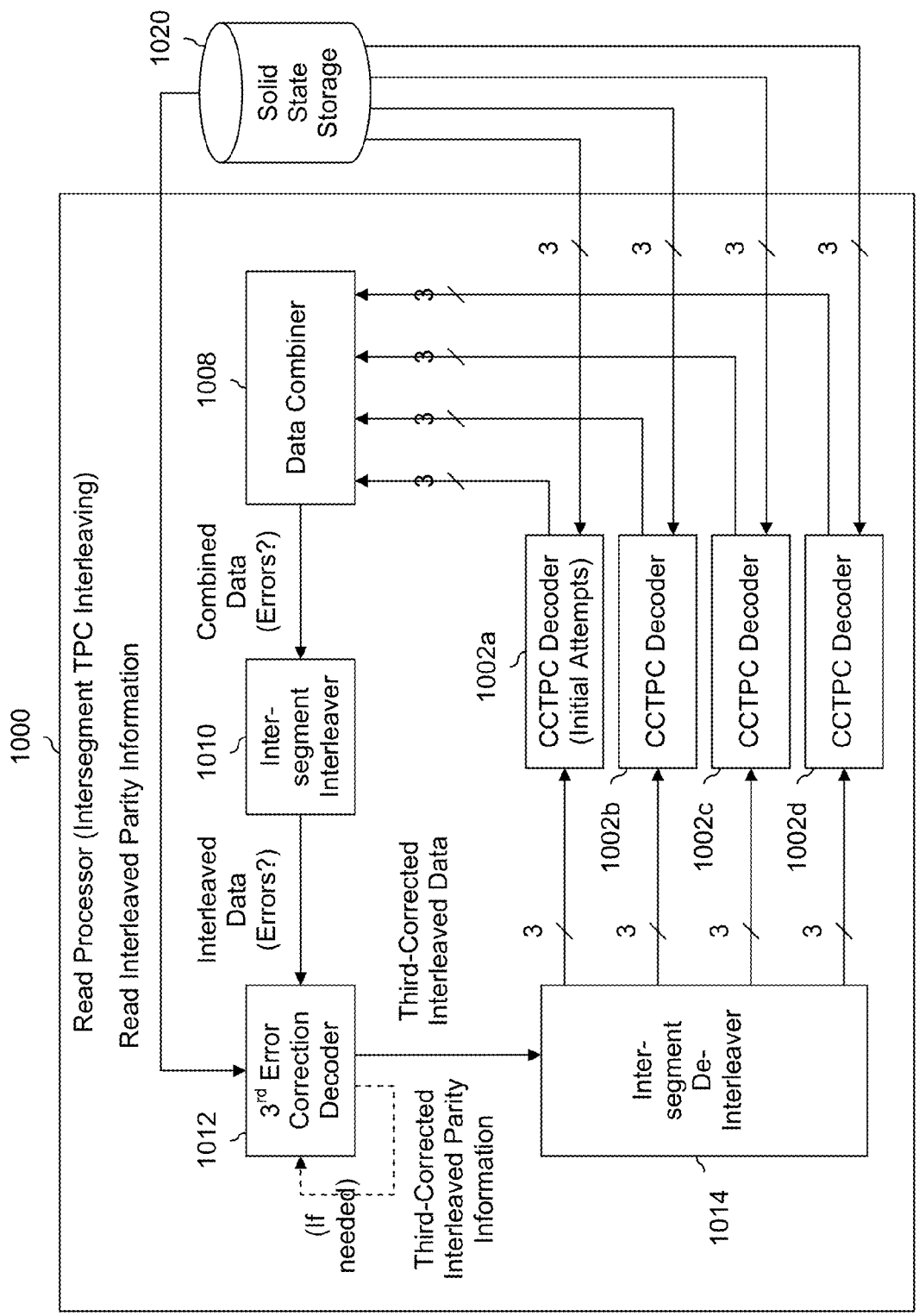
FIG. 10 is a diagram illustrating an embodiment of an intersegment TPC interleaving read processor.

FIG. 10 is a diagram illustrating an embodiment of an intersegment TPC interleaving read processor. Read processor 1000 corresponds to write processor 900 in FIG. 9. As is described above, the third code is used on an if needed basis because there is a penalty associated with fetching the other segments (which are interleaved together with the desired segment) from solid state storage. As such, processing begins with one segment and its associated parity information. A (e.g., single) segment of data (possibly containing errors), a first set of parity information (possibly containing errors), and a second set of parity information (possibly containing errors) are obtained from solid state storage 1020 and are input to CCTPC decoder 1002a. In this example, CCTPC decoder 1002a is designated as the decoder (e.g., of decoders 1002a-1002d) to be used for the initial decoding attempts. To preserve readability, the three signals passed from solid state storage 1020 to CCTPC decoder 1002a are not shown.

CCTPC decoder 1002 includes a first error correction decoder (not shown) and a second error correction decoder (not shown). Those two decoders take turns decoding the segment until either the segment is successfully decoded (at which point the segment is output and the process ends), or until a maximum number of attempts is reached (e.g., at which point the system decides that the first and second code will not be able to decode the segment on their own and the third code should be used). If the maximum number of attempts is reached, then the third code is used in decoding and the other segments interleaved with the desired segment are fetched from solid state storage 1020. Typically, most segments will be able to be decoded just using the first code and the second, and without using the third code and without fetching the other related segments from storage.

In this system, four segments and related parity information are interleaved together and the third code is applied over that intersegment TPC interleaved information. As such, the other three segments which are interleaved together with the desired segment, the first sets of parity information associated with those three related segments, and the second sets of parity information associated with those three related segments are obtained from solid state storage. For readability, the signals between solid state storage 1020 and CCTPC decoders 1002b-1002d are not labeled. CCTPC decoders 1002b-1002d then process the segments as described above (e.g., for some maximum number of iterations or until that particular segment is successfully decoded).

CCTPC decoders 1002a-1002d each output a first and second corrected segment of data, a first and second corrected first set of parity information, and a first and second corrected first set of parity information and pass it to data combiner 1008. The four segments, four first sets of parity information, and four second sets of parity information are combined by data combiner 1008 to generate combined data. Data combiner 1008 performs the same processing as data combiner 904 in FIG. 9.

Intersegment interleaver 1010 interleaves the combined data to generate interleaved data. The third error correction decoder 1012 takes the interleaved data from intersegment interleaver 1010 and read interleaved parity information from solid state storage 1020 and performs error correction decoding using the third code. Third-corrected interleaved parity information and third-corrected interleaved data are output by third error correction decoder 1012.

Intersegment de-interleaver 1014 de-interleaves the third-corrected interleaved data to obtain four (third-corrected) segments, four (third-corrected) first sets of parity information, and four (third-corrected) second sets of parity information (all of which have been corrected using the third code). A first segment, the first set of parity information associated with that segment, and the second set of parity information associated with that segment are processed by a first CCTPC decoder (1002a). Similarly, a second CCTPC decoder (1002b) processes a second segment, the associated first set of parity information, and the associated second set of parity information. Third CCTPC decoder 1002c and fourth CCTPC decoder 1002d similarly process similar sets of information.

If there are no remaining errors in the desired segment, then the desired segment (and possibly one or more of the other segments if they have been successfully decoded) are output (e.g., from the output of intersegment de-interleaver 1014). If there is still at least one error in the desired segment, then processing continues through the loop comprising CCTPC decoders 1002a-1002d, data combiner 1008, intersegment interleaver 1010, third error correction decoder 1012, and intersegment de-interleaver 1014. Note that unlike the inputs from solid state storage 1020, the inputs from intersegment de-interleaver 1014 have been corrected using the third code so the quality is better this time around and there is a better chance of successfully decoding the desired segment.

At some point, if the desired segment is unable to be successfully decoded (e.g., after some number of total or global attempts), the system declares an error, at least for the desired segment (i.e., because the other three segments may be able to be successfully decoded using only the first code and the second code).

Figure 11:
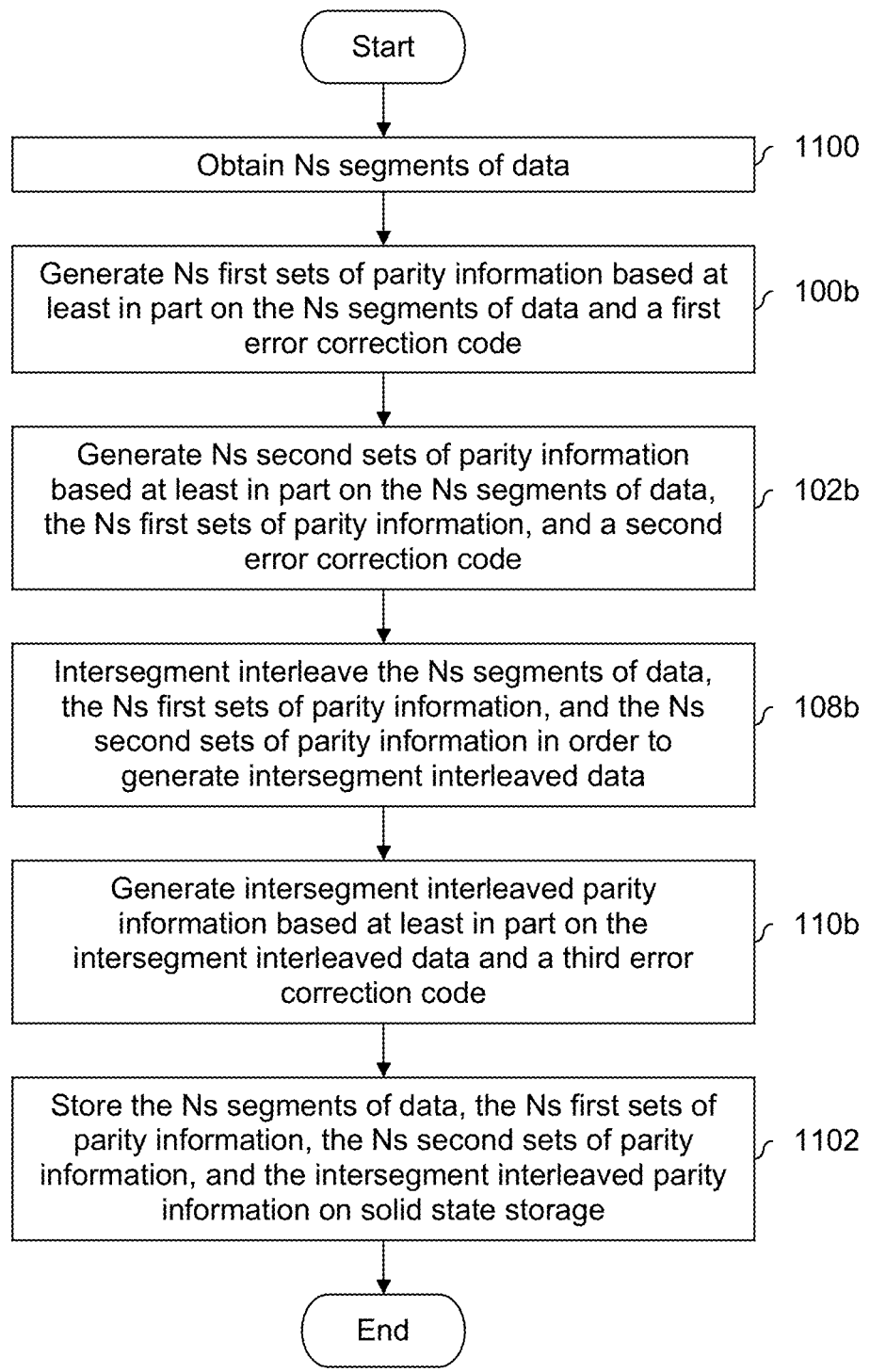
FIG. 11 is a flowchart illustrating an embodiment of a process for writing intersegment TPC interleaved information to storage.

FIG. 11 is a flowchart illustrating an embodiment of a process for writing intersegment TPC interleaved information to storage. FIG. 11 describes the processing performed by write processor 900 in FIG. 9 and is one embodiment of FIG. 1A. Steps in this figure having similar numbers to steps in FIG. 1A are examples of those steps (e.g., step 100b is an example of step 100 in FIG. 1A). At 1100, Ns segments of data are obtained. Ns is the number of segments which are interleaved together (with their associated parity information) in an intersegment TPC interleaver system. For example, in FIG. 9, Ns=4.

At 100b, Ns first sets of parity information are generated based at least in part on the Ns segments of data and a first error correction code. At 102b, Ns second sets of parity information are generated based at least in part on the Ns segments of data, the Ns first sets of parity information, and a second error correction code. For example, in FIG. 9, steps 100b and 102b are performed by CCTPC encoders 902a-902d.

At 108b, the Ns segments of data, the Ns first sets of parity information, and the Ns second sets of parity information are intersegment interleaved in order to generate intersegment interleaved data. For example, in FIG. 9, step 108b is performed by intersegment interleaver 906.

At 110b, intersegment interleaved parity information is generated based at least in part on the intersegment interleaved data and a third error correction code. For example, in FIG. 9, step 110b is performed by third error correction encoder 908.

At 1102, the Ns segments of data, the Ns first sets of parity information, the Ns second sets of parity information, and the intersegment interleaved parity information are stored on solid state storage. In FIG. 9, for example, the 12 outputs from CCTPC encoders 902a-902d and the (intersegment) interleaved parity information from third error correction encoder 908 are stored in solid state storage 920. In some embodiments, the Ns segments are stored together in a single page (which is able to be read back in a single read) and the associated parity information is stored in extra bytes associated with the page. In some embodiments the segments are placed into paired-plane pages as the read time may be shared by pages of this structure.

Figure 12A:
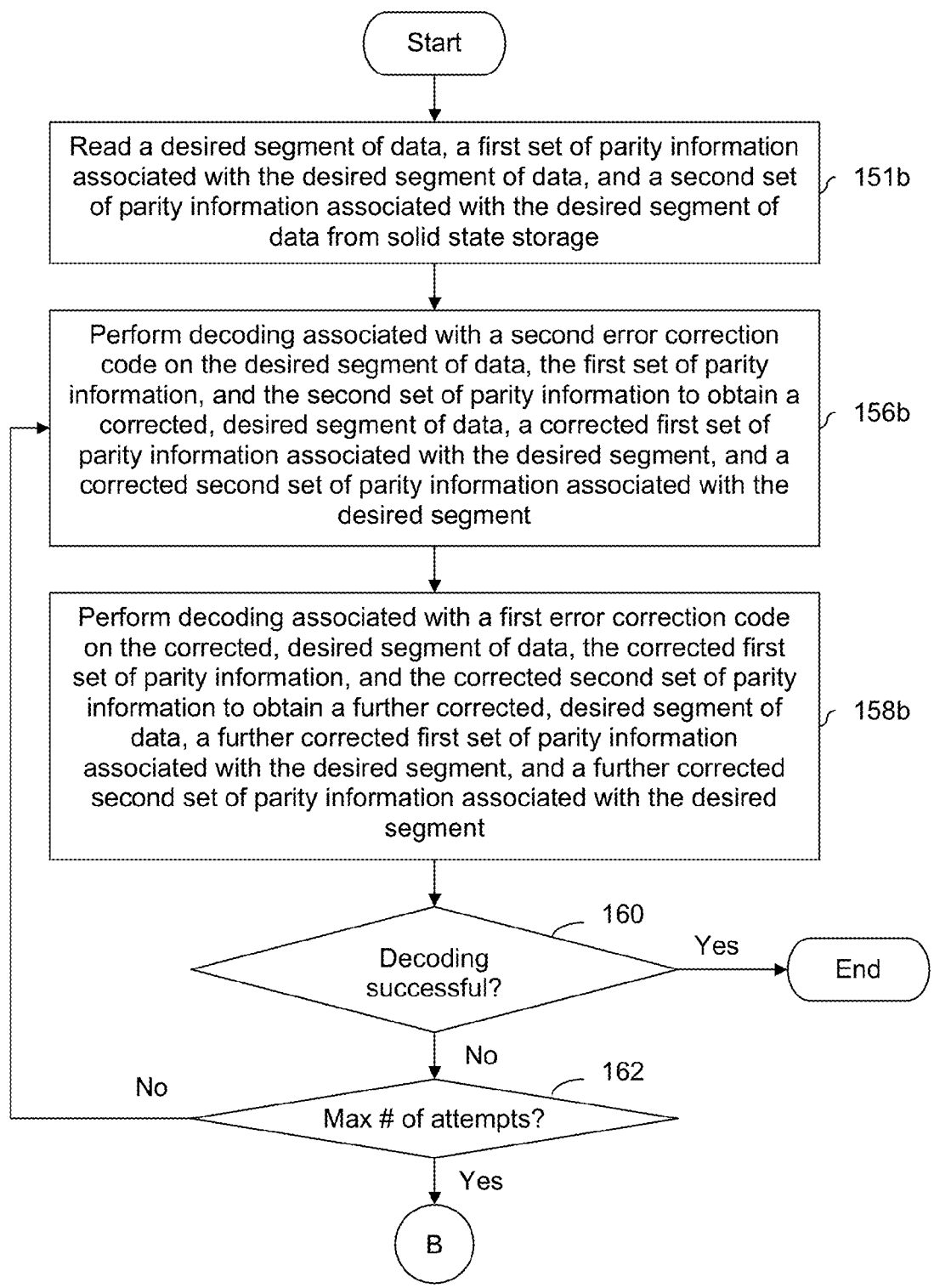
FIGS. 12A-12C are flowcharts illustrating an embodiment of a process for reading intersegment TPC interleaved information from storage.
Figure 12B:
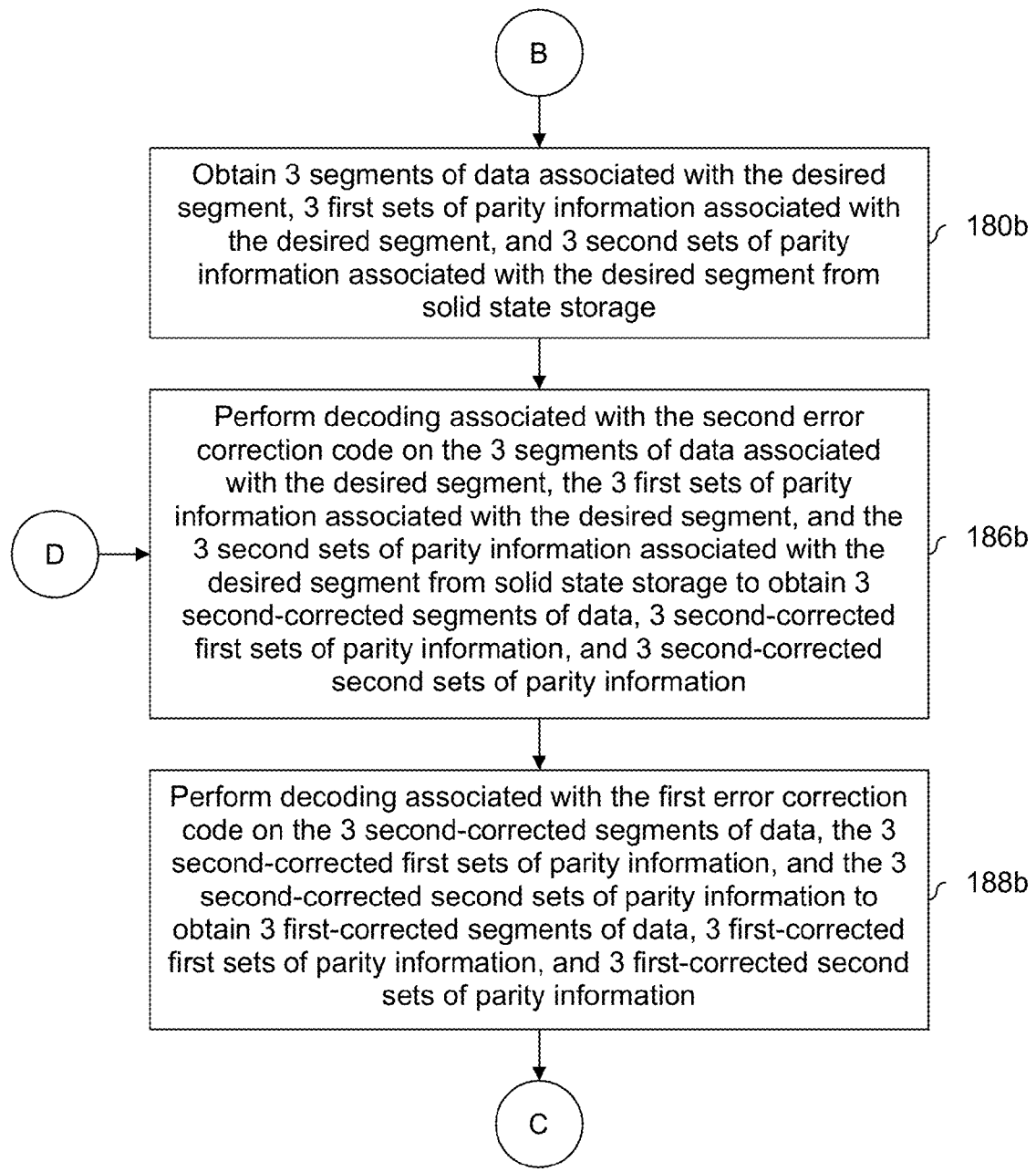
Figure 12C:
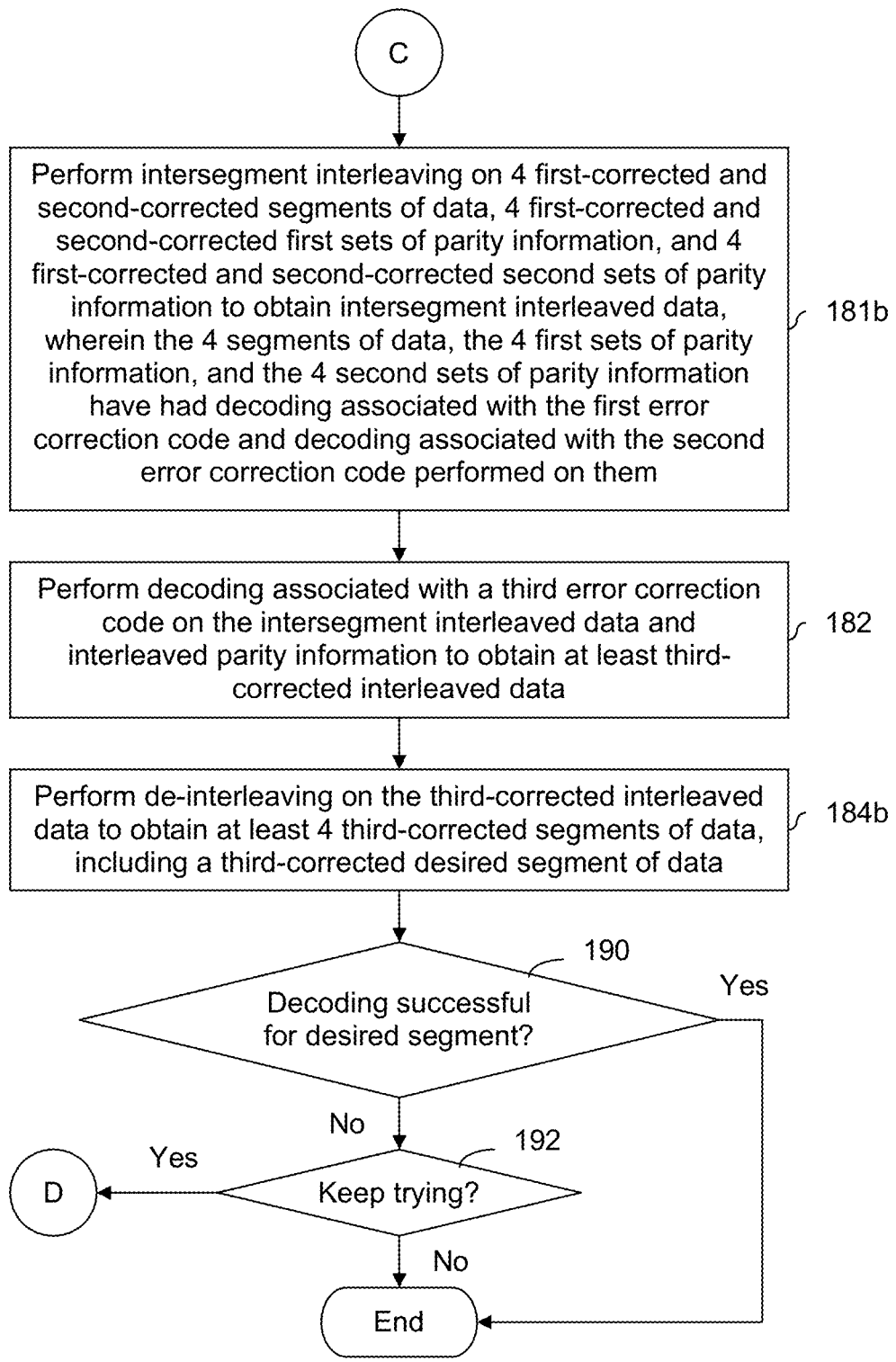

FIGS. 12A-12C are flowcharts illustrating an embodiment of a process for reading intersegment TPC interleaved information from storage. FIGS. 12A-12C describe the processing performed by read processor 1000 in FIG. 10. As before, steps having similar numbers are examples of those steps.

At 151b, a desired segment of data, a first set of parity information associated with the desired segment of data, and a second set of parity information associated with the desired segment of data are read from solid state storage. Since this is an intersegment TPC interleaving example, the segment obtained at 151b is referred to as a desired segment in order to distinguish it from the other three segments (an exemplary number) which are interleaved with the desired segment.

At 156b, decoding associated with a second error correction code is performed on the desired segment of data, the first set of parity information, and the second set of parity information to obtain a corrected and desired segment of data, a corrected first set of parity information associated with the desired segment, and a corrected second set of parity information associated with the desired segment. At 158b, decoding associated with a first error correction code is performed on the corrected and desired segment of data, the corrected first set of parity information, and the corrected second set of parity information to obtain a further corrected and desired segment of data, a further corrected first set of parity information associated with the desired segment, and a further corrected second set of parity information associated with the desired segment. For example, decoders 1004 and 1006 in FIG. 10A perform steps 156b and 158b, respectively.

It is determined at 160 if decoding of the desired segment is successful. If so, the process ends. If not, it is determined at 162 if a maximum number of attempts has been reached. If not, the process returns to step 156*b* using the current desired segment and associated parity information. In other words, the two decoders iteratively decode the desired segment, alternating turns and using the output from the other decoder.

If it is determined at 162 that the maximum number of attempts is reached, three segments of data associated with the desired segment, three first sets of parity information associated with the desired segment, and three second sets of parity information associated with the desired segment are obtained from solid state storage at 180*b*. In this particular example, Ns=4, so (Ns−1)=3.

At 186*b*, decoding associated with the second error correction code is performed on the three segments of data associated with the desired segment, the three first sets of parity information associated with the desired segment, and the three second sets of parity information associated with the desired segment to obtain three second-corrected segments of data, three second-corrected, first sets of parity information, and three second-corrected, second sets of parity information. At 188*b*, decoding associated with the first error correction code is performed on the three second-corrected segments of data, the three second-corrected, first sets of parity information, and the three second-corrected, second sets of parity information to obtain three first-corrected segments of data, three first-corrected, first sets of parity information, and three first-corrected, second sets of parity information. In FIG. 10, for example, steps 186*b* and 188*b* are performed by CCTPC decoders 1002*b*-1002*d*.

At 181*b*, intersegment interleaving is performed on the four first-corrected and second-corrected segments of data, four first-corrected and second-corrected first sets of parity information, and four first-corrected and second-corrected second sets of parity information to obtain intersegment interleaved data, wherein the four segments of data, the four first sets of parity information, and the four second sets of parity information have had decoding associated with the first error correction code and decoding associated with the second error correction code performed on them. In FIG. 10, step 181*b* is performed by data combiner 1008 and intersegment interleaver 1010.

At 182, decoding associated with a third error correction code is performed on the intersegment interleaved data and interleaved parity information to obtain at least third-corrected interleaved data. In FIG. 10, for example, step 182 is performed by third error correction decoder 1012 and in that example the interleaved data comes from intersegment interleaver 1010 and the interleaved parity information comes from solid state storage 1020.

At 184*b*, de-interleaving is performed on the third-corrected interleaved data to obtain at least four third-corrected segments of data, including a third-corrected desired segment of data. In FIG. 10, step 184*b* is performed by intersegment de-interleaver 1014 and intersegment de-interleaver 1014 also outputs parity information associated with the four segments.

At 190, it is determined if decoding is successful for the desired segment of data. The object of FIGS. 12A-12C is to decode a particular segment of data, so the process can end if the desired segment of data is successfully decoded (e.g., even if any of the other three segments interleaved with the desired segment of data is not successfully decoded, or is incompletely decoded so that the decoding result is indeterminate). If it is determined at 190 that the desired segment of data is successfully decoded, then the process ends.

If it is determined at 190 that the desired segment of data is not successfully decoded, it is determined at 192 whether to keep trying. For example, there may be some (absolute or total) maximum number of attempts where the system will give up and declare a decoding failure. If it is determined to keep trying, at 194, another decoding iteration associated with the second error correction code is performed at step 186*b*. In FIG. 10B, for example, this corresponds to performing another iteration through CCTPC decoders 1002*a*-1002*d*.

Although the intersegment TPC interleaving example described above is useful in some applications, it would be desirable if some of the benefits could be achieved using even less interleaved parity information (e.g., since the third code is used on an if needed basis, the interleaved parity information which is associated with the third code is only used for some of the segments). The following figures describe a second intrasegment TPC interleaving embodiment which offers a more efficient technique for performing intersegment TPC interleaving.

Intrasegment TPC Interleaving Example 2

Figure 13:
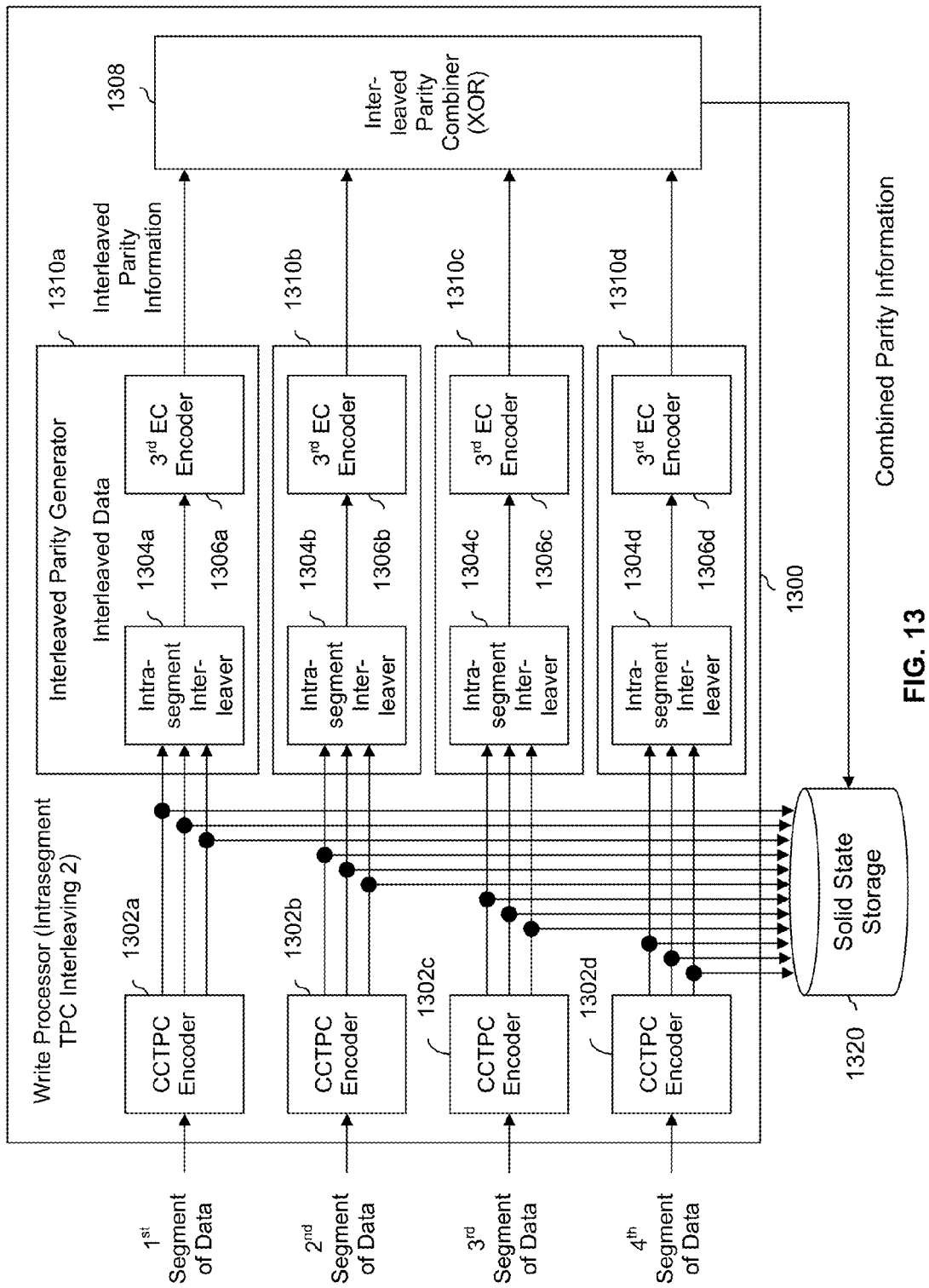
FIG. 13 is a diagram illustrating an embodiment of a second intrasegment TPC interleaving write processor.

FIG. 13 is a diagram illustrating an embodiment of a second intrasegment TPC interleaving write processor. In the example shown, four segments of data are passed (respectively) to CCTPC encoders 1302*a*-1302*d*. Each of the CCTPC encoders processes the segment input to it and outputs the segment of data, a first set of parity information (e.g., based on a first code), and a second set of parity information (e.g., based on a second code). CCTPC encoders 1302*a*-1302*d* operate as described in FIG. 7. To preserve readability, the segments and corresponding parity information output by CCTPC encoders 1302*a*-1302*d* are not labeled in FIG. 13.

The outputs of CCTPC encoders 1302*a*-1302*d* are passed (respectively) to intrasegment interleavers 1304*a*-1304*d*. Each of intrasegment interleavers 1304*a*-1304*d* interleaves the information passed to it and outputs a respective interleaved data signal.

The four interleaved data signals generated by intrasegment interleavers 1304*a*-1304*d* are input (respectively) by third error correction encoders 1306*a*-1306*d* which generates interleaved parity information. Each pair of intrasegment interleavers 1304*a*-1304*d* and third error correction encoders 1306*a*-1306*d* comprises an interleaved parity generator (e.g., 1310*a*-1310*d*). The four interleaved parity information signals are combined using an exclusive OR (i.e., XOR) to generate combined parity information. The following table shows one example where the interleaved parity information is 3 bits long.

TABLE 1

Example combined parity information generated using an XOR function.

|  | Bit 1 | Bit 2 | Bit 3 |
|---|---|---|---|
| Interleaved Parity Information 1 | 0 | 0 | 0 |
| Interleaved Parity Information 2 | 0 | 0 | 1 |
| Interleaved Parity Information 3 | 0 | 1 | 1 |
| Interleaved Parity Information 4 | 1 | 1 | 1 |
| Combined Parity Information | 1 | 0 | 1 |

The four segments, four first sets of parity information, four second sets of parity information (output by CCTPC encoders 1302*a*-1302*d*), and combined parity information (output by interleaved parity combiner 1308) are stored in solid state storage 1320. Note that combining the four parity information signals into a single combined parity information signal reduces the amount of overhead information that must be stored. In this example, only ¼ of the amount of parity information associated with the third code must be stored compared to storing all four interleaved parity information signals. Naturally, the amount of overhead information saved will depend at least upon the number of segments being combined.

Figure 14A:
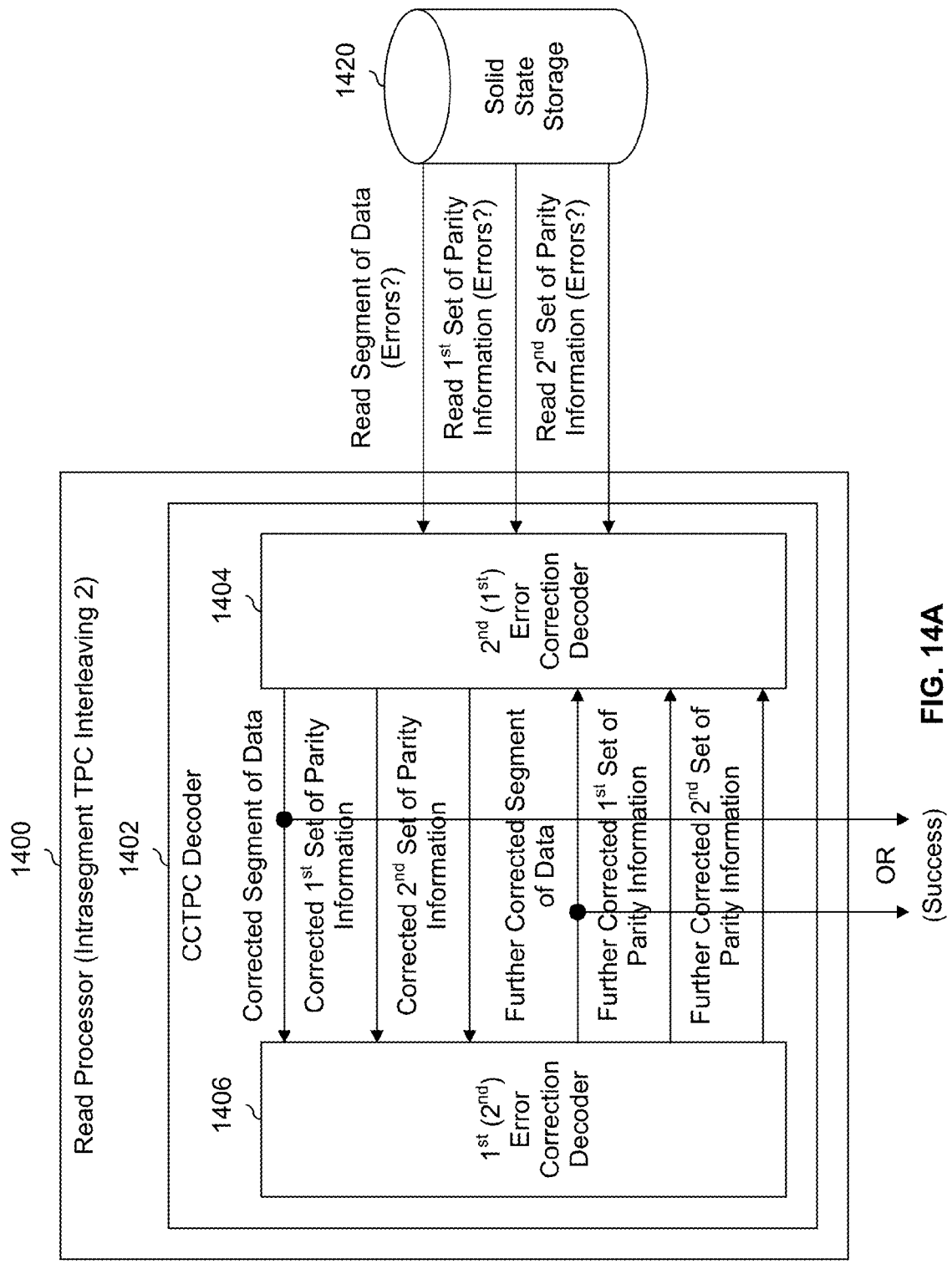
FIG. 14A is a diagram illustrating an embodiment of a second intrasegment TPC interleaving read processor showing a CCTPC decoder used during initial decoding attempts.

FIG. 14A is a diagram illustrating an embodiment of a second intrasegment TPC interleaving read processor showing a CCTPC decoder used during initial decoding attempts. Read processor 1400 corresponds to write processor 1300 in FIG. 13. In the example shown, a desired segment of data (which may include errors), a first set of parity information associated with that segment (which may include errors), and a second set of parity information associated with that segment (which may include errors) are read from solid state storage 1420 and are passed to CCTPC decoder 1402 in read processor 1400.

CCTPC decoder 1402 includes first error correction decoder 1406 and second error correction decoder 1404 which iteratively decode the desired segment. The two decoders take turns iteratively processing the segment and associated parity information until either the segment is successfully decoded (in which case it is output), or until a maximum number of attempts is reached (at which point the system decides that the first code and second code will be unable to decode the desired segment by themselves). If so, the third code is used and the components shown in the following figure are used.

Figure 14B:
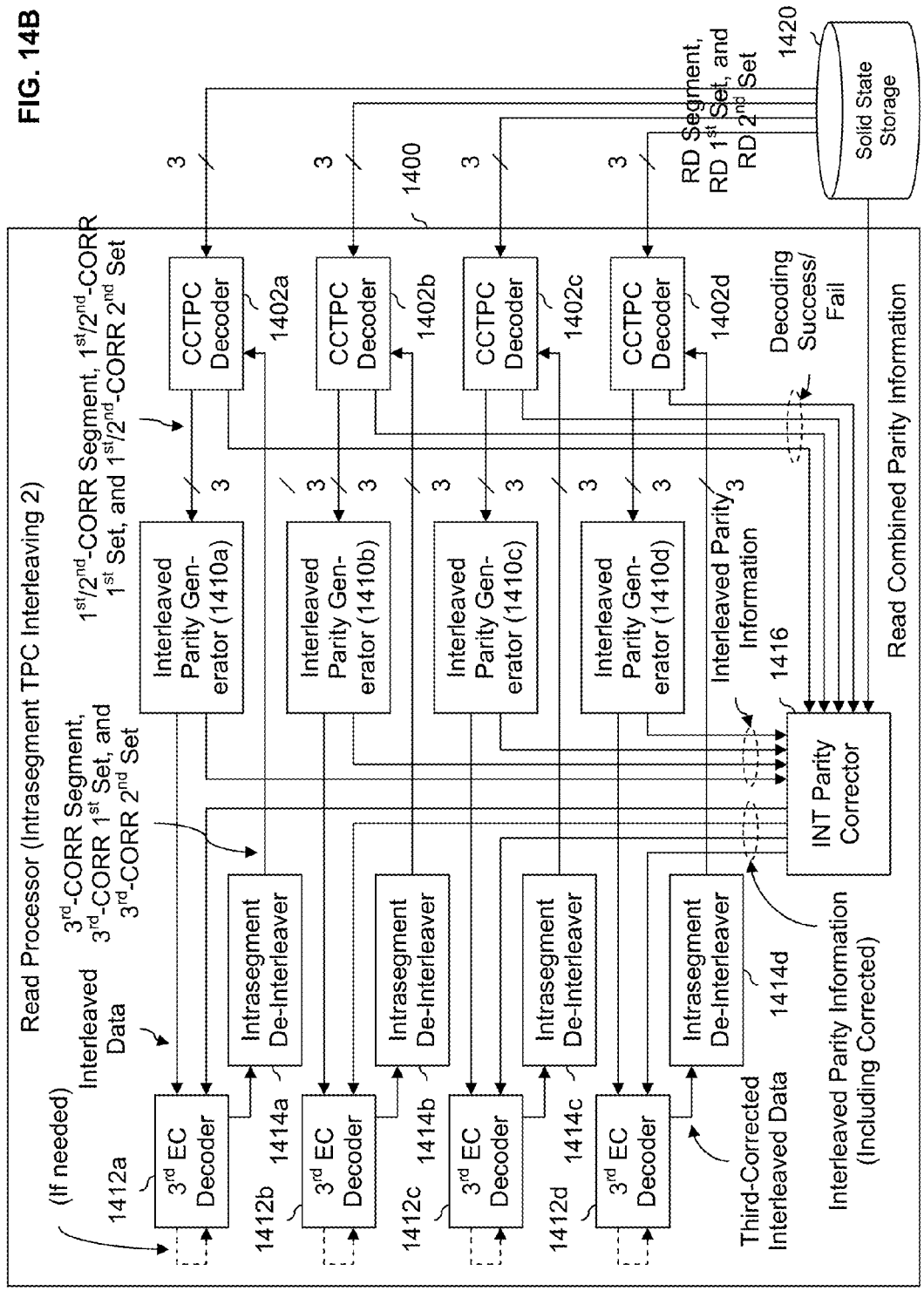
FIG. 14B is a diagram illustrating an embodiment of a second intrasegment TPC interleaving read processor which includes components associated with error correction decoding using a third code.

FIG. 14B is a diagram illustrating an embodiment of a second intrasegment TPC interleaving read processor which includes components associated with error correction decoding using a third code. In the example shown, a given segment was unable to be decoded using just the first and the second codes, so a third code and the stored combined parity information is used to decode the desired segment.

The desired segment and the three segments associated with it (i.e., the segments for which the interleaved parity information was combined together to form the combined parity information) are read from solid state storage 1420 and are passed along with their respective first and second sets of parity information (all of which may include errors) to CCTPC decoders 1402a-1402d, respectively. For example, CCTPC decoder 1402a processes information associated with a first segment, CCTPC decoder 1402b processes information associated with a second segment, and so on. To preserve readability, the signals from solid state storage 1420 to CCTPC decoders 1402a-1402d are not individually labeled.

Each of CCTPC decoders 1402a-1402d processes its respective segment (e.g., iteratively using a first and second error correction decoder), either until that particular segment is successfully decoded, or a maximum number of attempts is reached. Note that any of CCTPC decoders 1402a-1402d may comprise CCTPC decoder 1402 used for the initial decoding attempts in FIG. 14A. In some embodiments, the CCTPC decoder in FIG. 14B processing the desired segment is not run again in FIG. 14B (e.g., if the maximum number of attempts is the same as in FIG. 14A and thus duplicate results would be generated).

Each of CCTPC decoders 1402a-1402d respectively passes its corrected segment of data, its corrected first set of parity information, and its corrected second set of parity information (where "corrected" refers to being corrected using the first and second code) to a respective one of interleaved parity generators 1410a-1410d. To preserve readability, this is shown in FIG. 14B as three signals coming in to each of interleaved parity generators 1410a-1410d from a respective one of CCTPC decoders 1402a-1402d. Interleaved parity generators 1410a-1410d operate similar to interleaved parity generators 1310a-1310d described in FIG. 13, with the additional feature of outputting a copy of the interleaved data (e.g., generated by an internal intrasegment interleaver).

Interleaved parity generators 1410a-1410d pass their interleaved parity information to interleaved parity corrector 1416, which corrects the interleaved parity information input to it, if possible. First, interleaved parity corrector 1416 will analyze the four decoding results (e.g., "success" or "fail") from CCTPC decoders 1402a-1402d to determine if any correction can be performed. If two or more of CCTPC decoders 1402a-1402d output a fail signal, then no correction can be performed (i.e., since it cannot be determined with 100% certainty which of the interleaved parity information signals introduced the error and thus which one to correct). Making corrections under such circumstances may introduce more errors. However, if one and only one decoder indicates a decoding failure, then correction can be performed.

Next, if permitted by the decoding success/fail signals, interleaved parity corrector 1416 will determine which of the four interleaved parity information signals to correct. If a decoder outputs a successful signal, then that interleaved parity information signal will not be corrected (e.g., since there are no errors and changing any value in the interleaved parity information would actually introduce an error). The (single) interleaved parity information signal corresponding to the (single) decoding fail signal is the one that will be corrected (if needed). Interleaved parity corrected will compare the XOR results of the interleaved parity information output by interleaved parity generators 1410a-1410d against the read combined parity information from solid state storage 1420. If the values match for a given bit position, then that bit in the to-be-corrected interleaved parity information signal is not flipped. If the values do not match for a given bit position, then that bit in the to-be-corrected interleaved parity information signal is flipped.

The interleaved parity signals (including the corrected one) are then output from interleaved parity corrector 1416 and are passed to third error correction decoders 1412a-1412d. Third error correction decoders 1412a-1412d also input interleaved data from interleaved parity generators 1410a-1410d. Using those two signals, each of third error correction decoders 1412a-1412d performs error correction using the third code.

Third error correction decoders 1412a-1412d pass third-corrected interleaved data signals to intrasegment de-interleavers 1414a-1414d, respectively. Each of intrasegment de-interleavers 1414a-1414d generates a third-corrected segment of data, a third-corrected first set of parity information, and a third-corrected second set of parity information. Then, the third-corrected information is passed from intrasegment de-interleavers 1414a-1414d to CCTPC decoders 1402a-1402d, respectively, which performs processing on the third-corrected information. If needed, any number of additional decoding attempts (e.g., using the first and second code and/or using the third code) may be performed.

Figure 15:
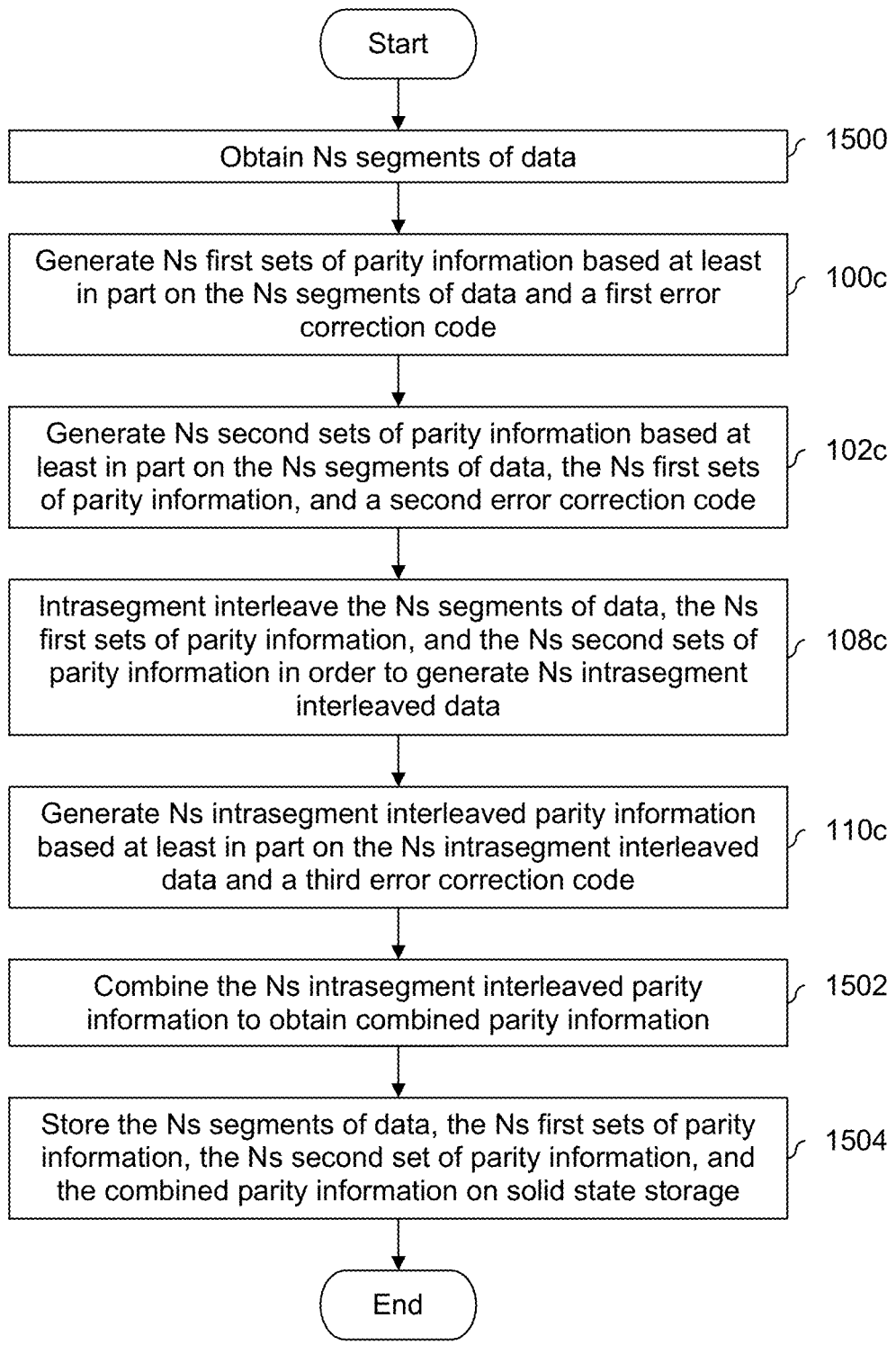
FIG. 15 is a flowchart illustrating a second embodiment of a process for writing intrasegment TPC interleaved data to solid state storage.

FIG. 15 is a flowchart illustrating a second embodiment of a process for writing intrasegment TPC interleaved data to solid state storage. FIG. 15 describes the processing performed by write processor 1300 in FIG. 13 and is an example of the process shown in FIG. 1A.

At 1500, Ns segments of data are obtained. Since this is an intrasegment TPC interleaving embodiment, Ns is not the number of segments which are interleaved together, but rather is the number of segments for which the associated interleaved parity information is combined together. For example, in FIG. 13, Ns=4. At 100c, Ns first sets of parity information are generated based at least in part on the Ns segments of data and a first error correction code. At 102c, Ns second sets of parity information are generated based at least in part on the Ns segments of data, the Ns first sets of parity information, and a second error correction code. For example, in FIG. 13, steps 100c and 102c are performed by CCTPC encoders 1302a-1302d.

At 108c, the Ns segments of data, the Ns first sets of parity information, and the Ns second sets of parity information are intrasegment interleaved in order to generate Ns intrasegment interleaved data. At 110c, Ns intrasegment interleaved parity information is generated based at least in part on the Ns intrasegment interleaved data and a third error correction code. In FIG. 13, for example, step 108c is performed by intrasegment interleavers 1304a-1304d and step 110c is performed by third error correction encoders 1306a-1306d.

At 1502, the Ns intrasegment interleaved parity information is combined to obtain combined parity information. In FIG. 13, for example, Ns=4, and interleaved parity combiner 1308 combines the interleaved parity information using an XOR.

At 1504, the Ns segments of data, the Ns first sets of parity information, the Ns second sets of parity information, and the combined parity information are stored on solid state storage. In FIG. 13, for example, the four segments of data, the four first sets of parity information, and the four second sets of parity information (output from CCTPC encoders 1302a-1302d) are stored in solid state storage 1320 and combined parity information (output by interleaved parity combiner 1308) is stored in solid state storage 1320.

FIGS. 16A-16D are flowcharts illustrating an embodiment of a process for reading intrasegment TPC interleaved information from storage. FIGS. 16A-16D describe the processing performed by read processor 1400 in FIGS. 14A and 14B.

At 1600, a desired segment of data, a first set of parity information, and a second set of parity information are read from solid state storage. In some embodiments, the information which is read is stored in a buffer just in case it is needed later if the initial decoding attempt(s) are unsuccessful.

At 1602, decoding associated with a second error correction code is performed on the desired segment of data, the first set of parity information, and the second set of parity information to obtain a corrected and desired segment of data, a corrected first set of parity information associated with the desired segment, and a corrected second set of parity information associated with the desired segment. At 1604, decoding associated with a first error correction code is performed on the corrected and desired segment of data, the corrected first set of parity information, and the corrected second set of parity information to obtain a further corrected and desired segment of data, a further corrected first set of parity information associated with the desired segment, and a further corrected second set of parity information associated with the desired segment. For example, steps 1602 and 1604 are performed respectively by error correction decoders 1404 and 1406 in FIG. 14A.

At 1606, it is determined if decoding of the desired segment is successful. If so, the process ends. If not, it is determined at 1608 if a maximum number of attempts has been reached. If not, decoding is performed again at 1602 and 1604 (e.g., using the current segment of data and associated parity information). This, for example, permits error correction decoders 1404 and 1406 to iteratively decode the desired segment as many times as is desired (i.e., Ns can be set to any desired number).

If it is determined at 1608 that a maximum number of attempts has been reached, then decoding with a third code is attempted. To do so, at 1620, Ns segments of data, Ns first sets of parity information, Ns second sets of parity information, and combined parity information associated with the desired segment are obtained. In some embodiments, the desired segment of data and its associated parity information are obtained from a buffer so that a duplicate read to solid state storage is not required. In the example of FIG. 14B, Ns=4.

At 1622, decoding associated with the second error correction code is performed on the Ns segments of data, the Ns first sets of parity information, and the Ns second sets of parity information to obtain Ns second-corrected segments of data, Ns second-corrected first sets of parity information, and Ns second-corrected second sets of parity information. At 1624, decoding associated with the first error correction code is performed on the Ns second-corrected segments of data, the Ns second-corrected first sets of parity information, and the Ns second-corrected second sets of parity information to obtain Ns first-corrected segments of data, Ns first-corrected first sets of parity information, and Ns first-corrected second sets of parity information. At 1626, it is determined if a maximum number of attempts is reached. If it has not yet been reached, then decoding is performed again at steps 1622 and 1624. Naturally, if a given segment is successfully decoded at 1622 or 1624, then that particular decoder is permitted to stop processing.

Figure 16A:
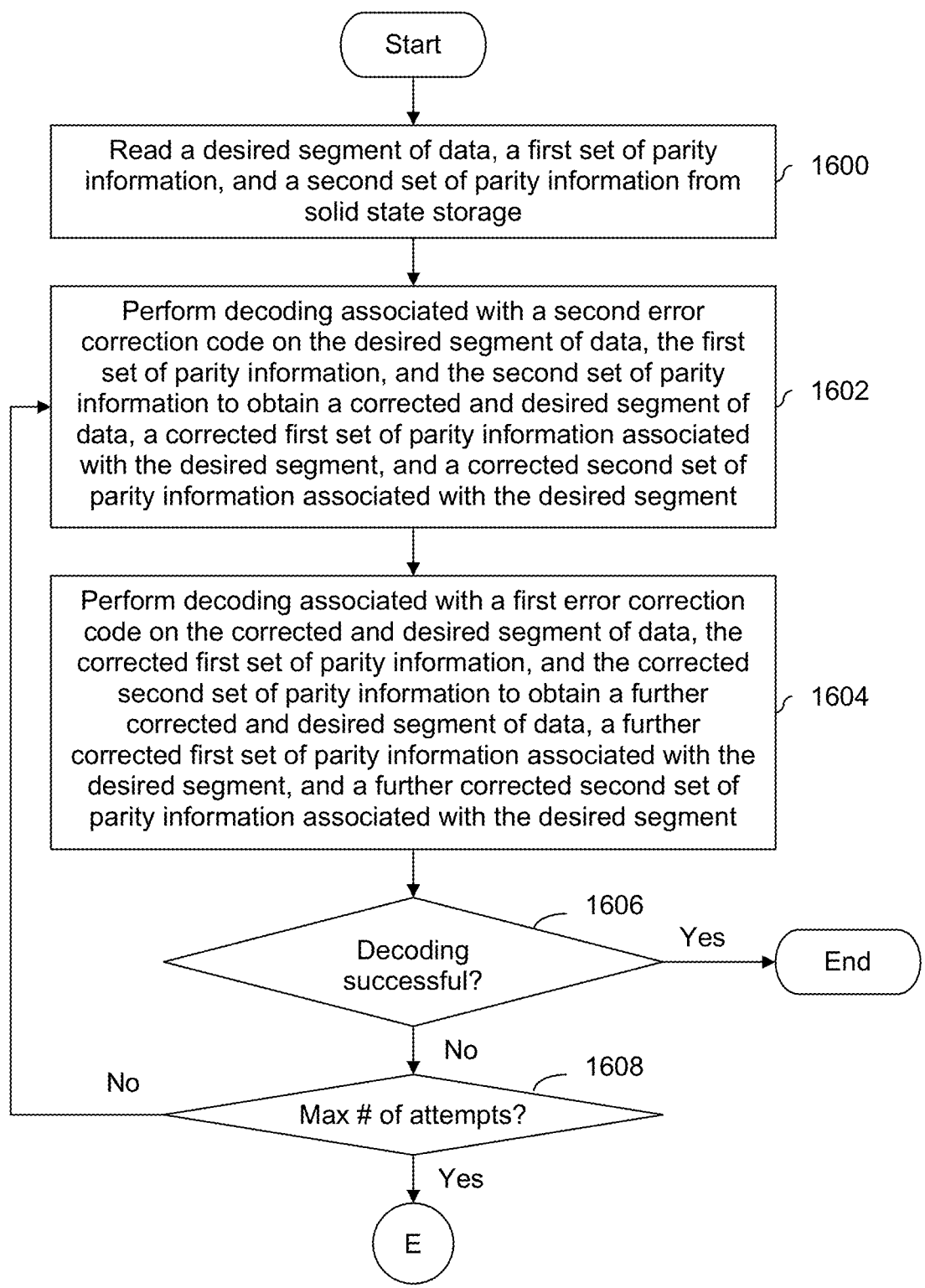
FIGS. 16A-16D are flowcharts illustrating an embodiment of a process for reading intrasegment TPC interleaved information from storage.
Figure 16B:
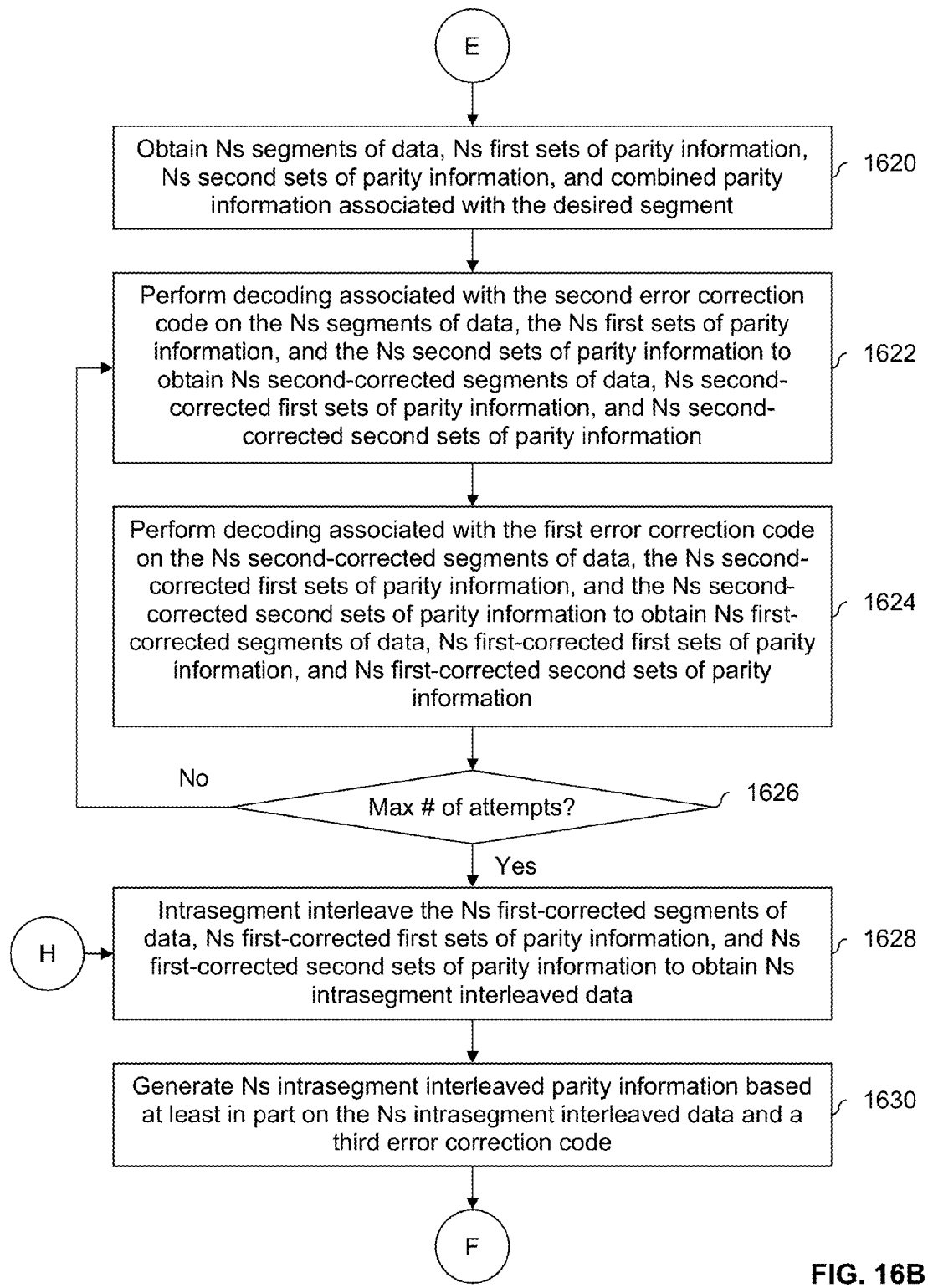
Figure 16C:
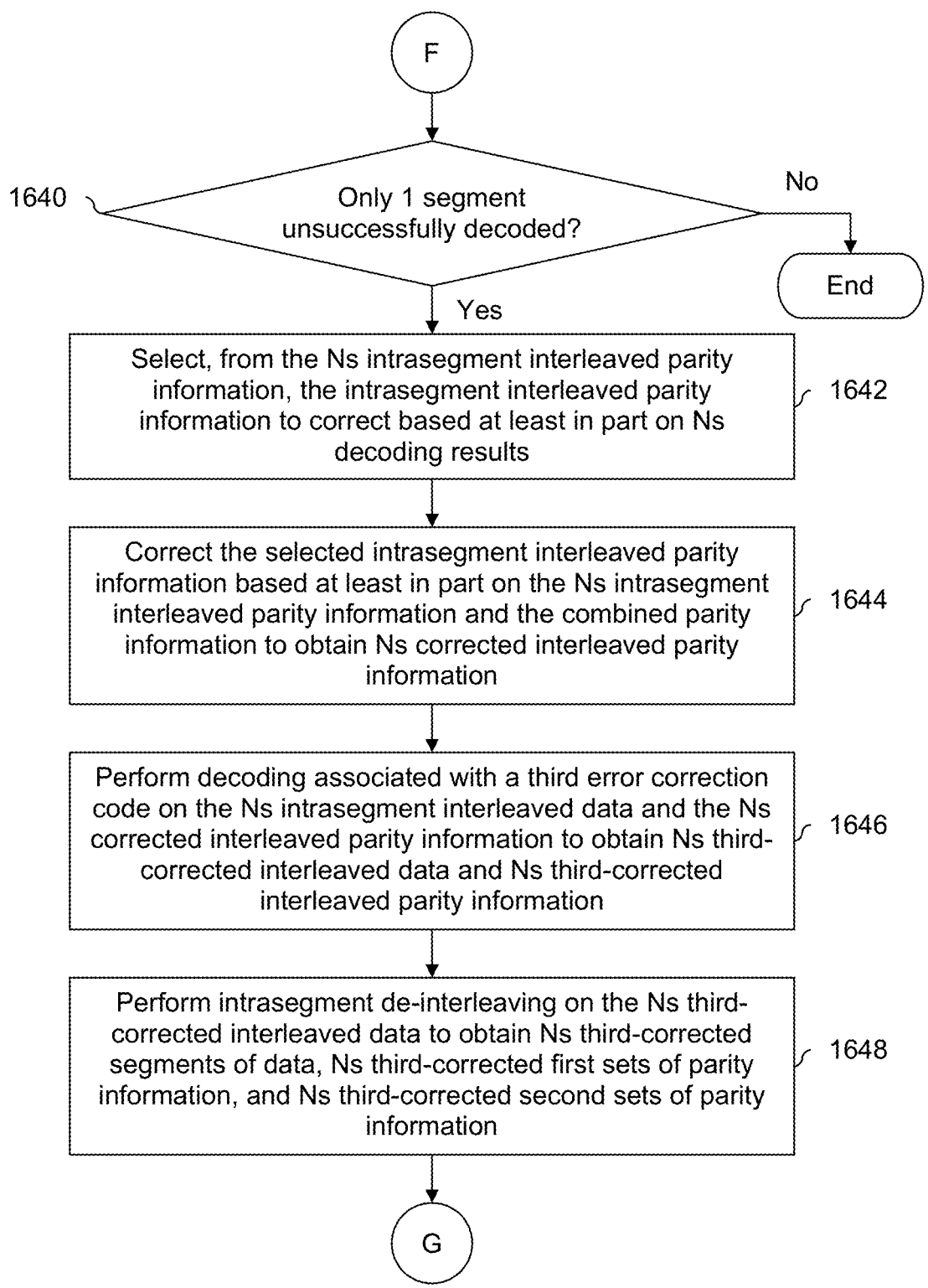
Figure 16D:
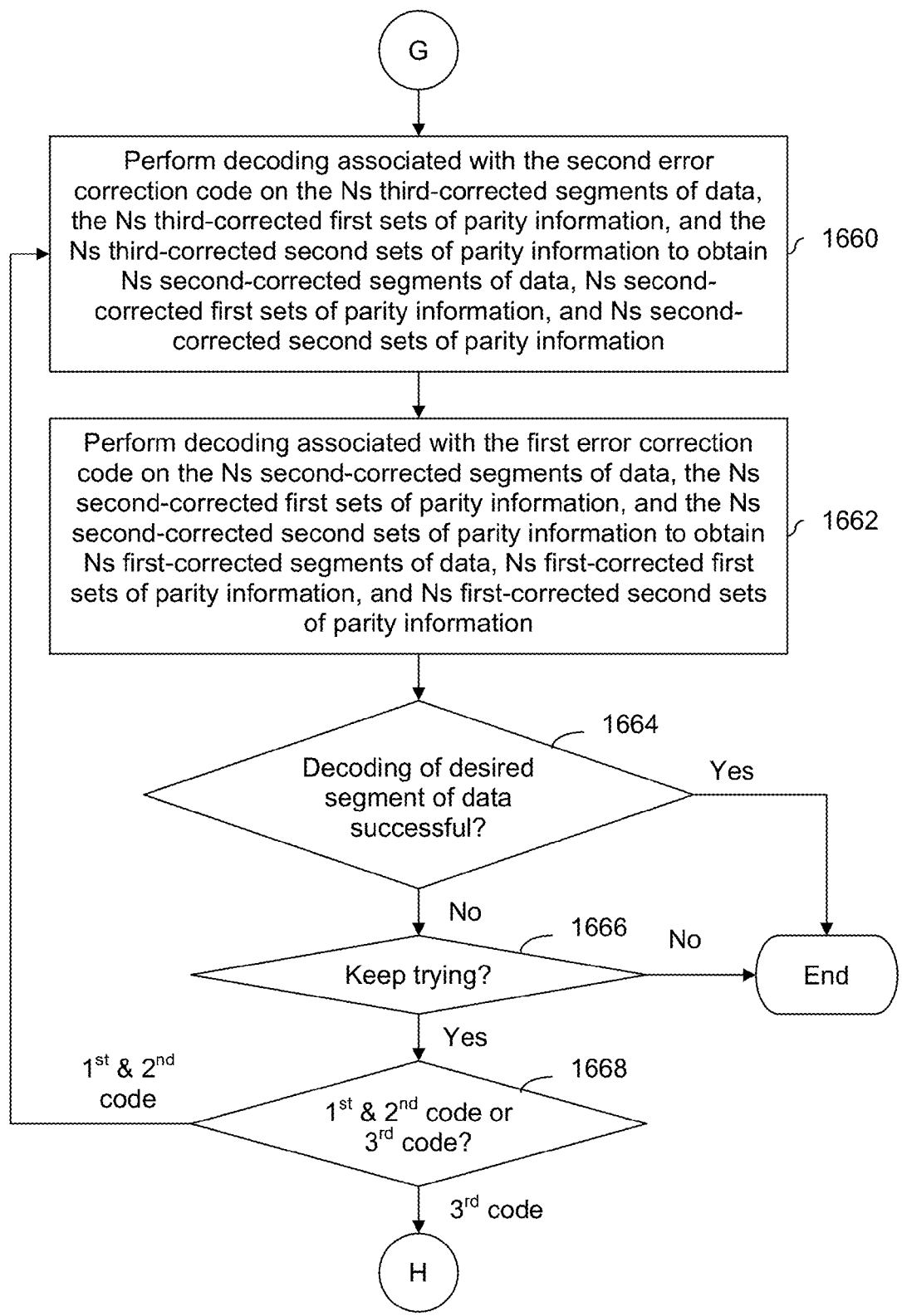

Note that the maximum number of attempts at step 1626 is not required to equal the number in step 1608 in FIG. 16A. In FIG. 14B, steps 1622, 1624, and 1626 are performed by CCTPC decoders 1402a-1402d. For example, this permits CCTPC decoders 1402a-1402d to iteratively decode the four segments as many times as is desired before decoding with the third code is attempted.

After the maximum number of attempts is reached at 1626, the Ns first-corrected segments of data, Ns first-corrected first sets of parity information, and Ns first-corrected second sets of parity information are intrasegment interleaved to obtain Ns intrasegment interleaved data at 1628. At 1630, Ns intrasegment interleaved parity information is generated based at least in part on the Ns intrasegment interleaved data and a third error correction code. In the example of FIG. 14B, steps 1628 and 1630 are performed by interleaved parity generators 1410a-1410d.

At 1640, it is determined if only one segment is unsuccessfully decoded. The intrasegment interleaved parity information can only be corrected if at most one segment is unsuccessfully decoded as described above. If the decision at step 1640 is no, then the process ends (e.g., and the process outputs a decoding failure signal). If the decision at step 1640 is yes, then at 1642, the intrasegment interleaved parity information to correct based at least in part on Ns decoding results is selected from the Ns intrasegment interleaved parity information. For example, the intrasegment interleaved parity information corresponding to the only unsuccessfully decoding result is selected at 1642.

At 1644, the selected intrasegment interleaved parity information is corrected based at least in part on the Ns intrasegment interleaved parity information and the combined parity information to obtain Ns corrected interleaved parity information. For example, in FIG. 14B, interleaved parity corrector 1416 combines the interleaved parity information from interleaved parity generators 1410a-1410d and compares that against the read combined parity information from solid state storage 1420. If, for a given bit position, the two bit values match, then the selected intrasegment interleaved parity information is not flipped at that bit position. If the two do not match, then the selected intrasegment interleaved parity information is flipped at that bit position.

At 1646, decoding associated with a third error correction code is performed on the Ns intrasegment interleaved data and the Ns corrected interleaved parity information to obtain Ns third-corrected interleaved data and Ns third-corrected interleaved parity information. In FIG. 14B, step 1623 is performed by third error correction decoders 1412a-1412d.

At 1648, intrasegment de-interleaving is performed on the Ns third-corrected interleaved data to obtain Ns third-corrected segments of data, Ns third-corrected first sets of parity information, and Ns third-corrected second sets of parity information. In FIG. 14B, for example, this step is performed by intrasegment de-interleavers 1414a-1414d.

At 1660, decoding associated with the second error correction code is performed on the Ns third-corrected segments of data, the Ns third-corrected first sets of parity information, and the Ns third-corrected second sets of parity information to obtain Ns second-corrected segments of data, Ns second-corrected first sets of parity information, and Ns second-corrected second sets of parity information. At 1662, decoding associated with the first error correction code is performed on the Ns second-corrected segments of data, the Ns second-corrected first sets of parity information, and the Ns second-corrected second sets of parity information to obtain Ns first-corrected segments of data, Ns first-corrected first sets of parity information, and Ns first-corrected second sets of parity information. In FIG. 14B, for example, steps 1660 and 1662 are performed by CCTPC decoders 1402a-1402d using the inputs from intrasegment de-interleavers 1414a-1414d (as opposed to the inputs from solid state storage 1420).

At 1664, it is determined if decoding of the desired segment of data is successful. If so, the process ends (e.g., and the process outputs the desired segment of data). If it is determined at 1664 that decoding of the desired segment is not successful, then at 1666 it is determined whether to keep trying. If so, it is determined at step 1668 whether to try the first code and the second code again, or to try the third code again. If it is determined at step 1668 to try the first code and the second code again, then steps 1660 and 1662 are performed again. In FIG. 14B, for example, CCTPC decoders 1402a-1402d perform another iterative decoding pass. If it is determined at step 1668 to try the third code again, then intrasegment interleaving is performed again at step 1628. In FIG. 14B, for example, this corresponds to interleaved parity generators 1410a-1410d processing the outputs from CCTPC decoders 1402a-1402d.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a second error correction decoder configured to perform decoding associated with a second error correction code;
a first error correction decoder configured to perform decoding associated with a first error correction code;
an intersegment interleaver configured to perform intersegment interleaving on Ns first-corrected and second-corrected segments of data, Ns first-corrected and second-corrected first sets of parity information, and Ns first-corrected and second-corrected second sets of parity information to obtain intersegment interleaved data, wherein:
the Ns segments of data, the Ns first sets of parity information, and the Ns second sets of parity information have decoding associated with the first error correction code and decoding associated with the second error correction code performed on them; and
Ns is the number of segments interleaved together by the intersegment interleaver;
a third error correction decoder configured to perform decoding associated with a third error correction code on the intersegment interleaved data and interleaved parity information to obtain at least third-corrected interleaved data; and
an intersegment de-interleaver configured to perform de-interleaving on the third-corrected interleaved data.

2. The system of claim 1 further comprising an interface configured to obtain (Ns-1) segments of data associated with a desired segment, (Ns-1) first sets of parity information associated with the desired segment, and (Ns-1) second sets of parity information associated with the desired segment from solid state storage.

3. The system of claim 2, wherein the interface is configured to obtain the (Ns-1) segments of data, the (Ns-1) first sets of parity information, and the (Ns-1) second sets of parity information in the event decoding, associated with the first error correction code and the second error correction code, is not successful for a maximum number of attempts.

4. The system of claim 3, wherein:
the second error correction decoder is configured to perform decoding associated with the second error correction code, including by: performing decoding associated with the second error correction code on the (Ns-1) segments of data associated with the desired segment, the (Ns-1) first sets of parity information associated with the desired segment, and the (Ns-1) second sets of parity information associated with the desired segment from the solid state storage to obtain (Ns-1) second-corrected segments of data, (Ns-1) second-corrected first sets of parity information, and (Ns-1) second-corrected second sets of parity information; and
the first error correction decoder is configured to perform decoding associated with the first error correction code, including by: performing decoding associated with the first error correction code on the (Ns-1) second-corrected segments of data, the (Ns-) second-corrected first sets of parity information, and the (Ns-1) second-corrected second sets of parity information to obtain (Ns-1) first-corrected segments of data, (Ns-1) first-corrected first sets of parity information, and (Ns-1) first-corrected second sets of parity information.

5. The system of claim 1, wherein the system includes a semiconductor device, including one or more of the following: an application-specific integrated circuit (ASIC) or a field-programmable gate array (FPGA).

6. A method, comprising:
using a processor to perform decoding associated with a second error correction code;
using the processor to perform decoding associated with a first error correction code;
performing intersegment interleaving on Ns first-corrected and second-corrected segments of data, Ns first-corrected and second-corrected first sets of parity information, and Ns first-corrected and second-corrected second sets of parity information to obtain intersegment interleaved data, wherein:
the Ns segments of data, the Ns first sets of parity information, and the Ns second sets of parity information have decoding associated with the first error correction code and decoding associated with the second error correction code performed on them; and
Ns is the number of segments interleaved together by the intersegment interleaver;

using the processor to perform decoding associated with a third error correction code on the intersegment interleaved data and interleaved parity information to obtain at least third-corrected interleaved data; and performing de-interleaving on the third-corrected interleaved data.

7. The method of claim 6 further comprising obtaining (Ns−1) segments of data associated with a desired segment, (Ns−1) first sets of parity information associated with the desired segment, and (Ns−1) second sets of parity information associated with the desired segment from solid state storage.

8. The method of claim 7, wherein obtaining is performed in the event decoding, associated with the first error correction code and the second error correction code, is not successful for a maximum number of attempts.

9. The method of claim 8, wherein:

using the processor to perform decoding associated with the second error correction code includes: performing decoding associated with the second error correction code on the (Ns−1) segments of data associated with the desired segment, the (Ns−1) first sets of parity information associated with the desired segment, and the (Ns−1) second sets of parity information associated with the desired segment from solid state storage to obtain (Ns−1) second-corrected segments of data, (Ns−1) second-corrected first sets of parity information, and (Ns−1) second-corrected second sets of parity information; and using the processor to perform decoding associated with the first error correction code includes: performing decoding associated with the first error correction code on the (Ns−1) second-corrected segments of data, the (Ns−1) second-corrected first sets of parity information, and the (Ns−1) second-corrected second sets of parity information to obtain (Ns−1) first-corrected segments of data, (Ns−1) first-corrected first sets of parity information, and (Ns−1) first-corrected second sets of parity information.

10. The method of claim 6, wherein the method is performed by a semiconductor device, including one or more of the following: an application-specific integrated circuit (ASIC) or a field-programmable gate array (FPGA).

11. A system, comprising:

an interleaved parity generator configured to:
  intrasegment interleave Ns segments of data, Ns first sets of parity information, and Ns second sets of parity information to obtain Ns intrasegment interleaved data,
  wherein Ns is the number of segments for which associated interleaved parity information is combined together; and
  generate Ns intrasegment interleaved parity information based at least in part on the Ns intrasegment interleaved data and a third error correction code;

an interleaved parity corrector configured to:
  select, from the Ns intrasegment interleaved parity information, the intrasegment interleaved parity information to correct based at least in part on Ns decoding results; and
  correct the selected intrasegment interleaved parity information based at least in part on the Ns intrasegment interleaved parity information and the combined parity information to obtain Ns corrected interleaved parity information;

a third error correction decoder configured to perform decoding associated with the third error correction code on the Ns intrasegment interleaved data and the Ns corrected interleaved parity information to obtain Ns third-corrected interleaved data and Ns third-corrected interleaved parity information; and an intrasegment de-interleaver configured to perform intrasegment de-interleaving on the Ns third-corrected interleaved data to obtain Ns third-corrected segments of data, Ns third-corrected first sets of parity information, and Ns third-corrected second sets of parity information.

12. The system of claim 11 further comprising:

a second error correction decoder configured to perform decoding associated with a second error correction code on the Ns third-corrected segments of data, the Ns third-corrected first sets of parity information, and the Ns third-corrected second sets of parity information to obtain Ns second-corrected segments of data, Ns second-corrected first sets of parity information, and Ns second-corrected second sets of parity information; and a first error correction decoder configured to perform decoding associated with a first error correction code on the Ns second-corrected segments of data, the Ns second-corrected first sets of parity information, and the Ns second-corrected second sets of parity information to obtain Ns first-corrected segments of data, Ns first-corrected first sets of parity information, and Ns first-corrected second sets of parity information.

13. The system of claim 11, wherein:

the Ns segments of data input by the interleaved parity generator include Ns first-corrected segments of data;
the Ns first sets of parity information input by the interleaved parity generator include Ns first-corrected first sets of parity information; and
the Ns second sets of parity information input by the interleaved parity generator include Ns first-corrected second sets of parity information.

14. The system of claim 11, wherein:

the Ns segments of data input by the interleaved parity generator include Ns second-corrected segments of data;
the Ns first sets of parity information input by the interleaved parity generator include Ns second-corrected first sets of parity information; and
the Ns second sets of parity information input by the interleaved parity generator include Ns second-corrected second sets of parity information.

15. The system of claim 11, wherein the interleaved parity corrector is configured to select and correct in the event there is only one segment which is unsuccessfully decoded.

16. The system of claim 11, wherein the system includes a semiconductor device, including one or more of the following: an application-specific integrated circuit (ASIC) or a field-programmable gate array (FPGA).

17. A method, comprising:

intrasegment interleaving Ns segments of data, Ns first sets of parity information, and Ns second sets of parity information to obtain Ns intrasegment interleaved data, wherein Ns is the number of segments for which associated interleaved parity information is combined together;

generating Ns intrasegment interleaved parity information based at least in part on the Ns intrasegment interleaved data and a third error correction code;

selecting, from the Ns intrasegment interleaved parity information, the intrasegment interleaved parity information to correct based at least in part on Ns decoding results;

correcting the selected intrasegment interleaved parity information based at least in part on the Ns intrasegment interleaved parity information and the combined parity information to obtain Ns corrected interleaved parity information;

using a processor to perform decoding associated with the third error correction code on the Ns intrasegment interleaved data and the Ns corrected interleaved parity information to obtain Ns third-corrected interleaved data and Ns third-corrected interleaved parity information; and performing intrasegment de-interleaving on the Ns third-corrected interleaved data to obtain Ns third-corrected segments of data, Ns third-corrected first sets of parity information, and Ns third-corrected second sets of parity information.

18. The method of claim 17 further comprising:

using the processor to perform decoding associated with a second error correction code on the Ns third-corrected segments of data, the Ns third-corrected first sets of parity information, and the Ns third-corrected second sets of parity information to obtain Ns second-corrected segments of data, Ns second-corrected first sets of parity information, and Ns second-corrected second sets of parity information; and using the processor to perform decoding associated with a first error correction code on the Ns second-corrected segments of data, the Ns second-corrected first sets of parity information, and the Ns second-corrected second sets of parity information to obtain Ns first-corrected segments of data, Ns first-corrected first sets of parity information, and Ns first-corrected second sets of parity information.

19. The method of claim 17, wherein:

the Ns segments of data include Ns first-corrected segments of data;

the Ns first sets of parity information include Ns first-corrected first sets of parity information; and the Ns second sets of parity information include Ns first-corrected second sets of parity information.

20. The method of claim 17, wherein:

the Ns segments of data include Ns second-corrected segments of data;

the Ns first sets of parity information include Ns second-corrected first sets of parity information; and the Ns second sets of parity information include Ns second-corrected second sets of parity information.

21. The method of claim 17, wherein selecting and correcting are performed in the event there is only one segment which is unsuccessfully decoded.

22. The method of claim 17, wherein the method is performed by a semiconductor device, including one or more of the following: an application-specific integrated circuit (ASIC) or a field-programmable gate array (FPGA).

* * * * *